US012805322B2

(12) United States Patent
Sano

(10) Patent No.: US 12,805,322 B2
(45) Date of Patent: Nov. 17, 2026

(54) SEMICONDUCTOR DEVICE

(71) Applicant: FUJI ELECTRIC CO., LTD., Kawasaki (JP)

(72) Inventor: Daiki Sano, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 314 days.

(21) Appl. No.: 18/756,248

(22) Filed: Jun. 27, 2024

(65) Prior Publication Data

US 2025/0046676 A1 Feb. 6, 2025

(30) Foreign Application Priority Data

Aug. 3, 2023 (JP) ................................ 2023-126824

(51) Int. Cl.

| | |
|---|---|
| ***H01L 23/473*** | (2006.01) |
| ***H10W 40/10*** | (2026.01) |
| ***H10W 40/47*** | (2026.01) |
| ***H10W 90/00*** | (2026.01) |
| *H10W 70/60* | (2026.01) |
| *H10W 70/685* | (2026.01) |
| *H10W 72/30* | (2026.01) |
| *H10W 74/10* | (2026.01) |

(52) U.S. Cl.

CPC ........... *H10W 40/47* (2026.01); *H10W 40/10* (2026.01); *H10W 90/00* (2026.01); *H10W 70/611* (2026.01); *H10W 70/685* (2026.01); *H10W 72/352* (2026.01); *H10W 74/111* (2026.01); *H10W 90/734* (2026.01)

(58) Field of Classification Search

CPC ...... H10W 40/10; H10W 90/00; H10W 40/47
See application file for complete search history.

(56) References Cited

U.S. PATENT DOCUMENTS

2014/0043765 A1* 2/2014 Gohara .............. H05K 7/20254 361/699
2014/0158324 A1 6/2014 Tochiyama et al.
2017/0332522 A1 11/2017 Ushijima
2019/0295924 A1 9/2019 Kawase et al.

FOREIGN PATENT DOCUMENTS

JP 2013-058518 A 3/2013
JP 2014-116404 A 6/2014
JP 2017-174991 A 9/2017
WO 2012/147544 A1 11/2012
WO 2016/117094 A1 7/2016
WO 2018/073965 A1 4/2018

* cited by examiner

*Primary Examiner* — William C Trapanese
(74) *Attorney, Agent, or Firm* — Rabin & Berdo. P.C.

(57) ABSTRACT

A semiconductor device, including: a semiconductor chip formed on a heat dissipation plate; a pool part including a bottom surface, two long lateral faces, and two short lateral faces defining a pool space; a guide part installed in the pool space and having first and second ends both connected to one of the short lateral face, at positions opposite to each other across an inlet formed on the one short lateral face, so as to separate a guide space from the pool space; and a guide plate disposed in the pool space on the guide part. In the plan view, the guide plate has a slit formed within an area thereof overlapping the guide space. The heat dissipation plate is disposed on the pool part. A geometrical area of a cross-section of the guide space becomes smaller as the cross-section is farther away from the inlet of the pool part.

13 Claims, 28 Drawing Sheets

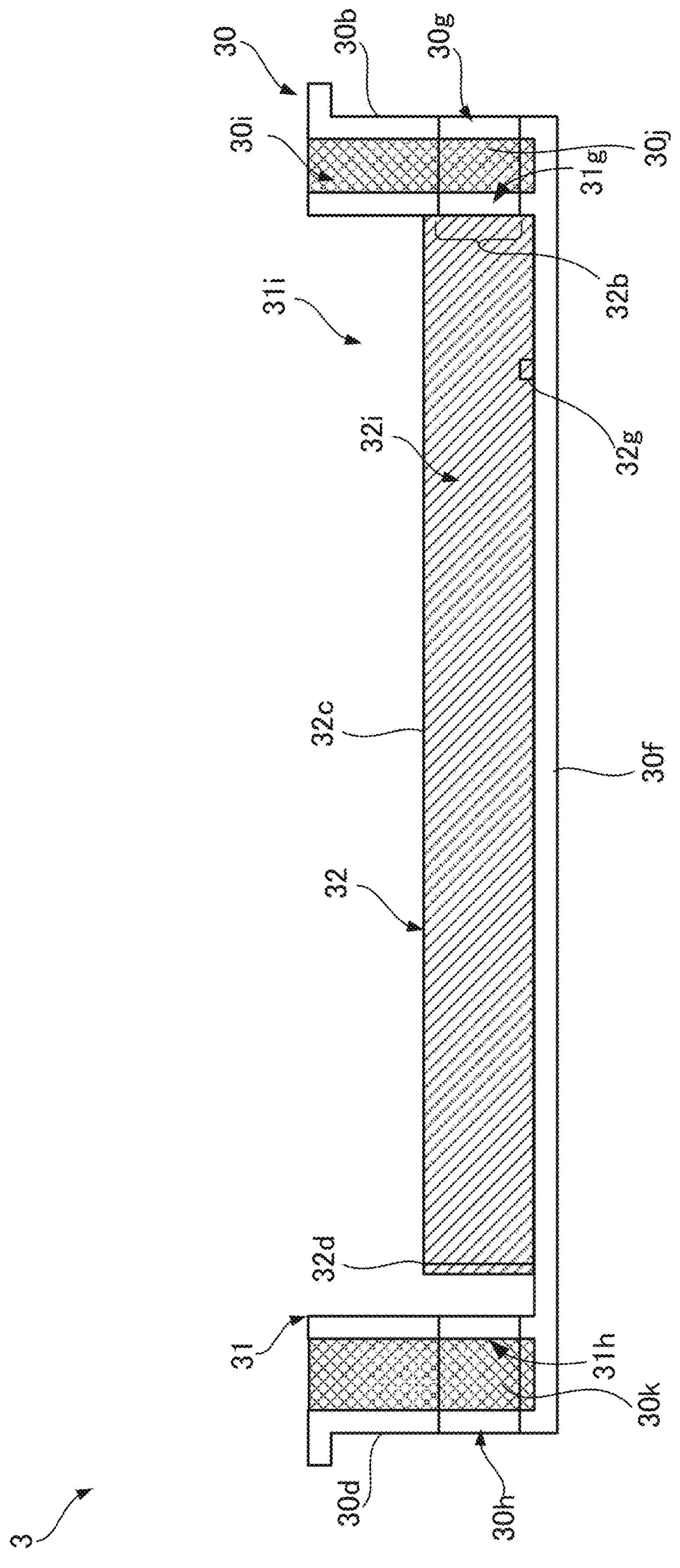
FIG. 23
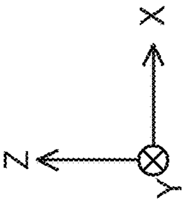

SEMICONDUCTOR DEVICE

CROSS-REFERENCE TO RELATED APPLICATION

This application is based upon and claims the benefit of priority of the prior Japanese Patent Application No. 2023-126824, filed on Aug. 3, 2023, the entire contents of which are incorporated herein by reference.

BACKGROUND OF THE INVENTION

1. Field of the Invention

The embodiments discussed herein relate to a semiconductor device.

2. Background of the Related Art

In cooling devices, objects to be cooled are placed on the front surface. To cool the objects, the cooling devices cause a refrigerant to flow through the interior (see, for example, Japanese Laid-open Patent Publications No. 2014-116404, No. 2017-174991, and No. 2013-058518). Semiconductor devices include such a cooling device and a semiconductor module, which is an object to be cooled, disposed on the cooling device (see, for example, International Publication Pamphlet No. WO 2012/147544).

SUMMARY OF THE INVENTION

According to an aspect, there is provided a semiconductor device, including: a semiconductor chip; a heat dissipation plate, having: a front surface including a placement area, a rear surface having a cooling area corresponding to the placement area, and a plurality of fins provided in the cooling area; the semiconductor chip being disposed in the placement area; a pool part, including: a bottom surface having a rectangular shape in a plan view of the semiconductor device, a pair of long lateral faces, and a first short lateral face and a second short lateral face, with an inlet formed on the first short lateral face, to thereby define a pool space surrounded by the bottom surface, the pair of long lateral faces and the first and second short lateral faces; a guide part configured to be installed in the pool space on the bottom surface, the guide part having a first end and a second end that are both connected to an inner side of the first short lateral face, at positions opposite to each other across the inlet, so as to separate a guide space from the pool space, the guide space communicating with the inlet; and a guide plate disposed in the pool space on the guide part, the guide plate having a shape of a flat plate with a slit, wherein in the plan view of the semiconductor device, the guide plate is positioned to have two gaps on two opposite sides thereof, respectively between the guide plate and the pair of long lateral faces, and the slit is formed within an area of the guide plate overlapping the guide space; the rear surface of the heat dissipation plate is disposed on the pool part in such a manner that the plurality of fins is housed in the pool space and over the guide plate; and the guide part is installed such that a geometrical area of a cross-section of the guide space becomes smaller as the cross-section is farther away from the inlet of the pool part.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 23 is a cross-sectional view of a cooling device (excluding a guide plate) of a fourth embodiment;

DETAILED DESCRIPTION OF THE INVENTION

Several embodiments will be described below with reference to the accompanying drawings. Note that in the following the terms "front surface" and "top face" refer to the X-Y plane facing upward (the +Z direction) in a semiconductor device 1 of the drawings. Similarly, the term "upper" refers to the upward direction (the +Z direction) of the illustrated semiconductor device 1. On the other hand, the terms "rear surface" and "bottom face" refer to the X-Y plane facing downward (the −Z direction) in the illustrated semiconductor device 1. Similarly, the term "lower" refers to the downward direction (the −Z direction) of the illustrated semiconductor device 1. These terms have the same orientational relationships in other drawings if needed. "High" and "upper" in position refer to upper positions (the +Z direction) in the illustrated semiconductor device 1. On the other hand, "low" and "lower" in position refer to lower positions (the −Z direction) in the illustrated semiconductor device 1. The terms "front surface", "top face", and "upper"; the terms "rear surface", "bottom face", and "lower"; and the term "lateral face" are simply expedient expressions used to specify relative positional relationships, and are not intended to limit the technical ideas of the embodiments described herein. For example, the terms "upper" and "lower" do not necessarily imply the vertical direction to the ground surface. That is, the "upper" and "lower" directions are not defined in relation to the direction of the gravitational force. In addition, the term "major component" in the following refers to a constituent having a concentration equal to 80 vol % or higher. The phrase "substantially the same" refers to where two or more things being compared have a difference of no more than ±10%. In addition, the terms "perpendicular", "orthogonal", and "parallel" may also include substantially perpendicular, substantially orthogonal, and substantially parallel, as appropriate, which may include a margin of error of ±10° or less.

(a) First Embodiment

Figure 1:
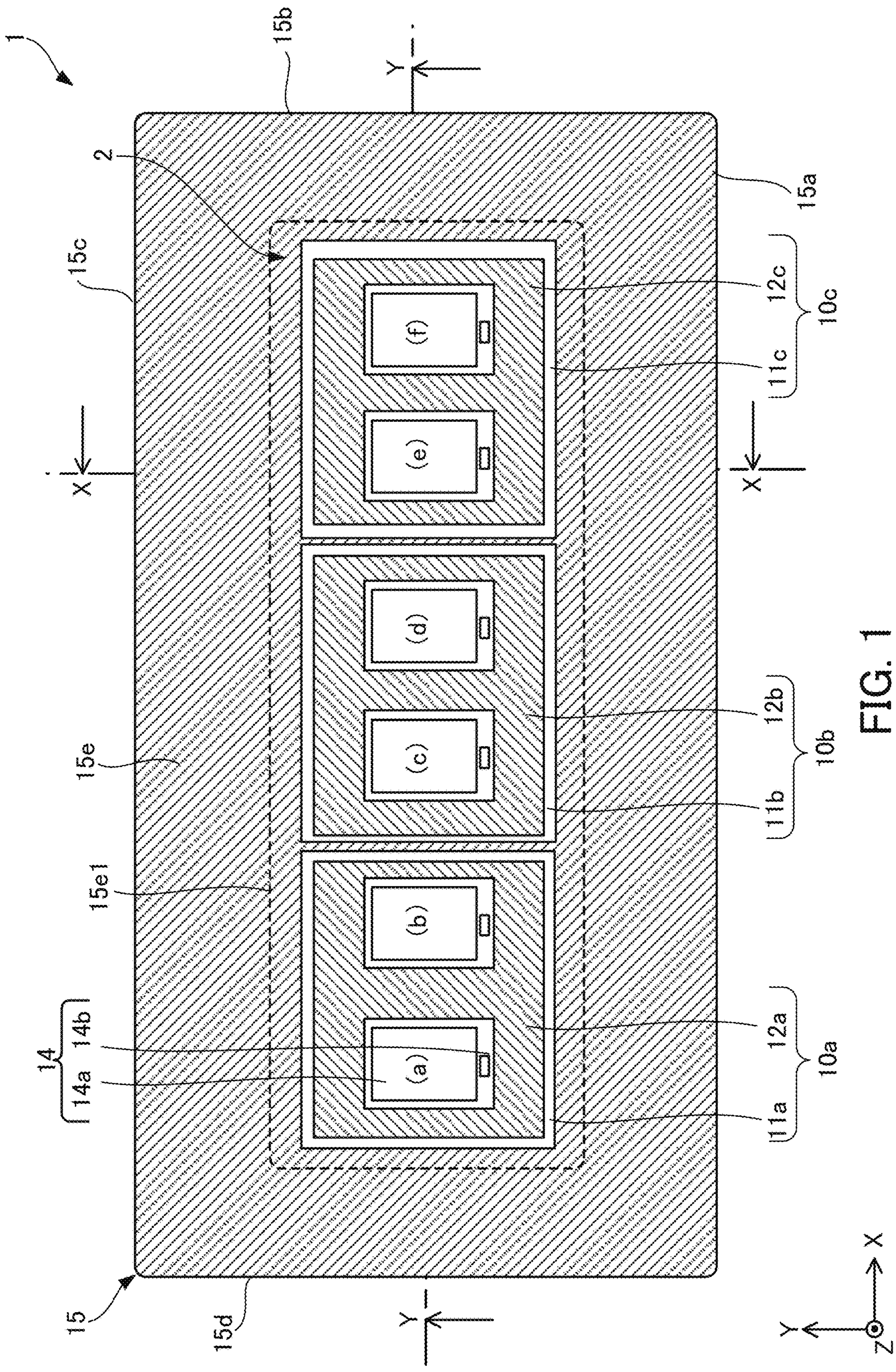
FIG. 1 is a plan view of a semiconductor device according to a first embodiment.
Figure 2:
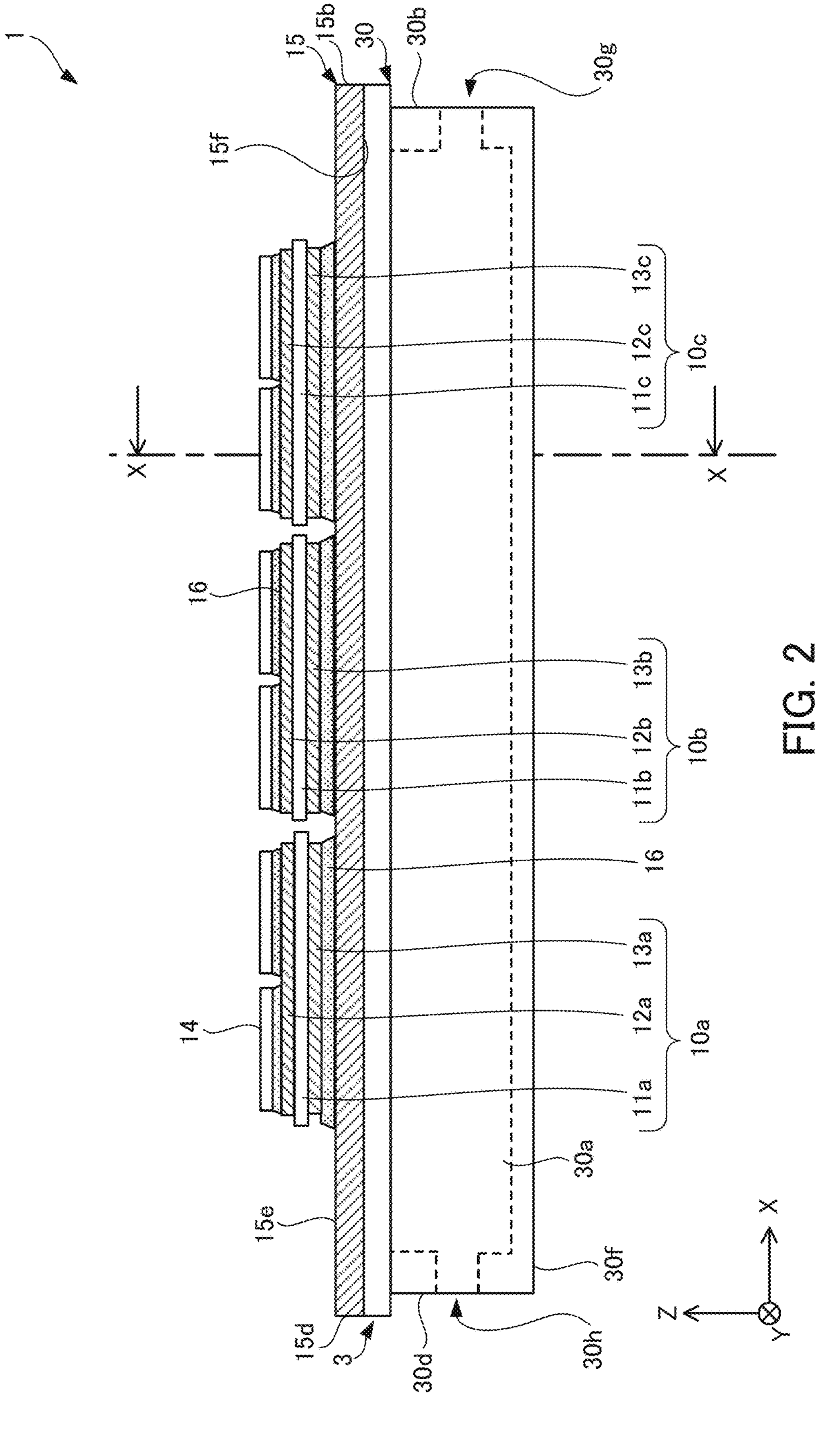
FIG. 2 is a lateral view of the semiconductor device of the first embodiment.

Next described is a semiconductor device with reference to FIGS. 1 and 2. FIG. 1 is a plan view of a semiconductor device according to a first embodiment. FIG. 2 is a lateral view of the semiconductor device of the first embodiment. Note that the lateral view of FIG. 2 is obtained when the semiconductor device 1 of FIG. 1 is viewed in the +Y direction.

The semiconductor device 1 includes a semiconductor unit 2, a heat dissipation plate 15, and a cooling device 3, as depicted in FIGS. 1 and 2. The semiconductor unit 2 includes insulated circuit boards 10*a*, 10*b*, and 10*c* and semiconductor chips 14 each disposed on the front surface of the insulated circuit board 10*a*, 10*b*, or 10*c* via a bonding member 16. The insulated circuit boards 10*a*, 10*b*, and 10*c* include insulating plates 11*a*, 11*b*, and 11*c*, respectively; conductive patterns 12*a*, 12*b*, and 12*c*, respectively, provided on the front surfaces of the insulating plates 11*a*, 11*b*, and 11*c*; and metal plates 13*a*, 13*b*, and 13*c*, respectively, provided on the rear surfaces of the insulating plates 11*a*, 11*b*, and 11*c*. Note that the term "insulated circuit boards 10" may be used in the following description when no distinction is made among the insulated circuit boards 10*a*, 10*b*, and 10*c*. Similarly, the terms "insulating plates 11", "conductive patterns 12", and "metal plates 13" are used when no distinction needs to be made among the insulating plates 11*a*, 11*b*, and 11*c*, the conductive patterns 12*a*, 12*b*, and 12*c*, and the metal plates 13*a*, 13*b*, and 13*c*, respectively.

The insulating plates 11 and the metal plates 13 have a rectangular shape in plan view. In addition, the insulating plates 11 and the metal plates 13 may have R- or C-chamfered corners. The individual metal plates 13 are smaller in size than the insulating plates 11, and are thus formed inside the insulating plates 11 in plan view.

The insulating plates 11 may be, for example, ceramic boards. The ceramic boards are made of ceramic with excellent thermal conductivity. The ceramic here is a material whose major component is, for example, aluminum oxide, aluminum nitride, or silicon nitride. The insulating plates 11 have a rectangular shape in plan view.

The conductive patterns 12 are respectively formed all over the corresponding insulating plates 11, except for their rims. Preferably, in plan view, edges of each of the conductive patterns 12, facing the outer periphery of the insulating plate 11 coincide with those of the metal plate 13, facing the outer periphery of the insulating plate 11. For this reason, the insulated circuit boards 10 maintain stress balance between the insulating plates 11 and the metal plates 13 placed on the rear surfaces of the insulating plates 11. This reduces damage to the insulating plates 11, such as excessive warpage and crack formation. The conductive patterns 12 are made of a material with excellent electrical conductivity. The material is, for example, copper, aluminum, or an alloy containing at least one of these. In order to provide improved corrosion resistance, plating may be applied to coat the surfaces of the conductive patterns 12. In this case, a material used for plating is, for example, nickel, a nickel-phosphorus alloy, or a nickel-boron alloy. The conductive patterns 12 on the insulating plates 11 are created by forming metal plates on the front surfaces of the insulating plates 11 and performing etching or the like on the metal plates. Alternatively, the conductive patterns 12 preliminarily cut out of metal plates are pressure bonded to the front surfaces of the insulating plates 11. Note that the conductive patterns 12 included in the semiconductor device 1 of the first embodiment are merely an example, and appropriate changes may be made to the number of conductive patterns, their shape, size and so on, as needed basis.

The metal plates 13 are made of a metal with excellent thermal conductivity. The metal is, for example, copper, aluminum, or an alloy containing at least one of these. Here, the metal contains copper. In order to provide improved corrosion resistance, plating may be applied to coat the surfaces of the metal plates 13. In this case, a material used for plating includes nickel. The plating material is, for example, nickel, a nickel-phosphorus alloy, or a nickel-boron alloy.

As the insulated circuit boards 10 having the above-described configuration, for example, direct copper bonding (DCB) boards or active metal brazed (AMB) boards may be used. The insulated circuit boards 10 conduct heat generated in semiconductor chips 14 to be described later to the rear surfaces of the insulated circuit boards 10 via the conductive patterns 12, the insulating plates 11, and the metal plates 13 and then dissipate the heat.

The semiconductor chips 14 include a switching element whose major component is, for example, silicon. The switching element is, for example, a reverse-conducting insulated gate bipolar transistor (RC-IGBT). The RC-IGBT has a single-chip structure with a circuit where a free wheeling diode (FWD) is connected antiparallel to an IGBT.

Each of the semiconductor chips 14 has, on its rear surface, a collector electrode as an input electrode, and also has, on its front surface, a gate electrode as a control electrode 14*b* and an emitter electrode as an output electrode 14*a*. The control electrode 14*b* may be provided at the center of one side of the front surface of the semiconductor chip 14. Note however that the control electrode 14*b* does not necessarily have to be located in the center of one side of the front surface of the semiconductor chip 14, and may be displaced from the center in the ±X direction.

Alternatively, instead of the RC-IGBT, each of the semiconductor chips 14 may use, as the switching element, a power metal-oxide-semiconductor field-effect transistor (MOSFET) whose major component is silicon carbide. In the power MOSFET, a body diode functions as an FWD. The semiconductor chip 14 of this type has, for example, a drain electrode as an input electrode on its rear surface, and a gate electrode as the control electrode 14*b* and a source electrode as the output electrode 14*a* on the front surface.

Instead of the semiconductor chips 14, different semiconductor chips may be used, each of which has silicon as its major component and includes a pair of a switching element and a diode element. The switching element is, for example, a power MOSFET or IGBT. Each semiconductor chip including such a switching element, for example, has an input electrode (a drain electrode in the case of a power MOSFET, and a collector electrode in the case of an IGBT) on the rear surface, and has the control electrode 14*b* (a gate electrode) and the output electrode 14*a* (a source electrode in the case of a power MOSFET, and an emitter electrode in the case of an IGBT) on the front surface. On the other hand, as for the diode element, for example, a Schottky barrier diode (SBD) or a P-intrinsic-N (PiN) diode is used as an FWD. The semiconductor chips including such a diode element have an output electrode (cathode electrode) functioning as a main electrode on the rear surface, and have an input electrode (anode electrode) functioning as a main electrode on the front surface.

The rear surface of each of the semiconductor chips 14 is bonded onto the conductive pattern 12 via the bonding member 16. The bonding member 16 is solder or a sintered compact. The solder used is lead-free solder containing a predetermined alloy as a major component. The predetermined alloy includes tin. Such an alloy is, for example, at least one of the followings: a tin-silver-copper alloy, a tin-zinc-bismuth alloy, a tin-copper alloy, a tin-silver-indium-bismuth alloy, and a tin-antimony alloy. Further, the solder may include an additive, such as nickel, germanium, cobalt, or silicon. In addition, the sintered material used in bonding by sintering is, for example, powder of silver, iron, copper, aluminum, titanium, nickel, tungsten, or molybdenum.

The heat dissipation plate 15 includes a front surface 15*e* having a rectangular shape in plan view; a rear surface 15*f* opposite to the front surface 15*e*; and a long lateral face 15*a*, a short lateral face 15*b*, a long lateral face 15*c*, and a short lateral face 15*d* surrounding in order all four sides of the front surface 15*e* and the rear surface 15*f*. On the front surface 15*e* of the heat dissipation plate 15, a unit area 15*e*1 is provided in which the semiconductor unit 2 is disposed. The insulated circuit boards 10*a*, 10*b*, and 10*c* of the semiconductor unit 2 are arranged in the unit area 15*e*1 of the front surface 15*e*, in a line along the long lateral faces 15*a* and 15*c*. At this time, the metal plates 13 of the insulated circuit boards 10 are bonded to the front surface 15*e* with the above-described bonding member 16. The heat dissipation plate 15 is made of a metal with excellent electrical conductivity. The metal is, for example, copper, aluminum, or an alloy containing at least one of these. Here, the metal contains copper. In order to provide improved corrosion resistance, plating may be applied to coat the surface of the heat dissipation plate 15. In this case, a material used for plating includes nickel. The plating material is, for example, nickel, a nickel-phosphorus alloy, or a nickel-boron alloy. Details of the heat dissipation plate 15 will be described later.

Note that, in the first embodiment, by disposing the semiconductor unit 2 on the heat dissipation plate 15, the six semiconductor chips 14 are arranged in a line along the long lateral faces 15*a* and 15*c* of the heat dissipation plate 15. These semiconductor chips 14 are identified as (a) to (f) in order, starting from the one closest to an outlet 30*h* to be described later.

The cooling device 3 is provided on the rear surface 15*f* of the heat dissipation plate 15. The cooling device 3 includes a chassis 30. In plan view, the chassis 30 is disposed to oppose the heat dissipation plate 15, and includes a rectangular bottom plate 30*f* as well as a long lateral wall 30*a*, a short lateral wall 30*b*, a long lateral wall 30*c*, and a short lateral wall 30*d*, which surround the bottom plate 30*f* on all four sides in order (see FIG. 3). The long lateral wall 30*a*, the short lateral wall 30*b*, the long lateral wall 30*c*, and the short lateral wall 30*d* are the same in height. The rear surface 15*f* of the heat dissipation plate 15 is attached to the upper parts of the long lateral wall 30*a*, the short lateral wall 30*b*, the long lateral wall 30*c*, and the short lateral wall 30*d*. Outward barbs may be provided on the edges of the long lateral wall 30*a*, the short lateral wall 30*b*, the long lateral wall 30*c*, and the short lateral wall 30*d* in the +Z direction. Herewith, the area joined to the rear surface 15*f* of the heat dissipation plate 15 increases, which improves the adhesion to the rear surface 15*f* of the heat dissipation plate 15. An inlet 30*g* is formed on the short lateral wall 30*b*. An outlet 30*h* is formed on the short lateral wall 30*d*. The inlet 30*g* and the outlet 30*h* communicate with the inside of the chassis 30.

The cooling device 3 with the above configuration may include a pump and a heat dissipation device (radiator). The pump allows a refrigerant to flow into the inlet 30*g* of the cooling device 3, and the refrigerant flowing into the cooling device 3 from the inlet 30*g* circulates through the cooling device 3. The refrigerant absorbs heat from the semiconductor unit 2 while flowing through the cooling device 3. The refrigerant having circulated through the cooling device 3 flows out from the outlet 30*h*. The radiator receives the refrigerant flowing out from the cooling device 3 and radiates the heat removed from the semiconductor unit 2 and then absorbed by the refrigerant to the outside. The pump causes the heat-released refrigerant to flow into the cooling device 3 again through the inlet 30*g* and circulate inside the cooling device 3. Examples of the refrigerant used here include water, an antifreeze solution (ethylene glycol aqueous solution), and a long-life coolant. Details of the cooling device 3 will be described later.

The semiconductor device 1 may have a case (not illustrated) for housing the semiconductor unit 2, provided on the front surface 15*e* of the heat dissipation plate 15. In the case, for example, an N terminal, a P terminal, and an output terminal are integrally formed. These terminals are each connected to the semiconductor unit 2 in the case. In addition, within the semiconductor unit 2, the semiconductor unit 2 and various terminals may be connected by wiring members (not illustrated). The wiring members are, for example, wires and lead frames. Note that the case is formed by injection molding using a thermoplastic resin including a filler. Such a resin is, for example, polyphenylene sulfide (PPS); polybutylene terephthalate (PBT); or polyamide (PA). The filler contains, for example, glass fibers, glass beads, calcium carbide, talc, magnesium oxide, or aluminum hydroxide.

In addition, the inside of the case may be sealed with a sealing member. The sealing member is, for example, resin mixed with a filler. The a thermosetting thermosetting resin is, for example, epoxy resin, phenolic resin, maleimide resin, or polyester resin. The filler is ceramic with insulation properties and high thermal conductivity. Such a filler is, for example, silicon oxide, aluminum oxide, boron nitride, or aluminum nitride.

Figure 3:
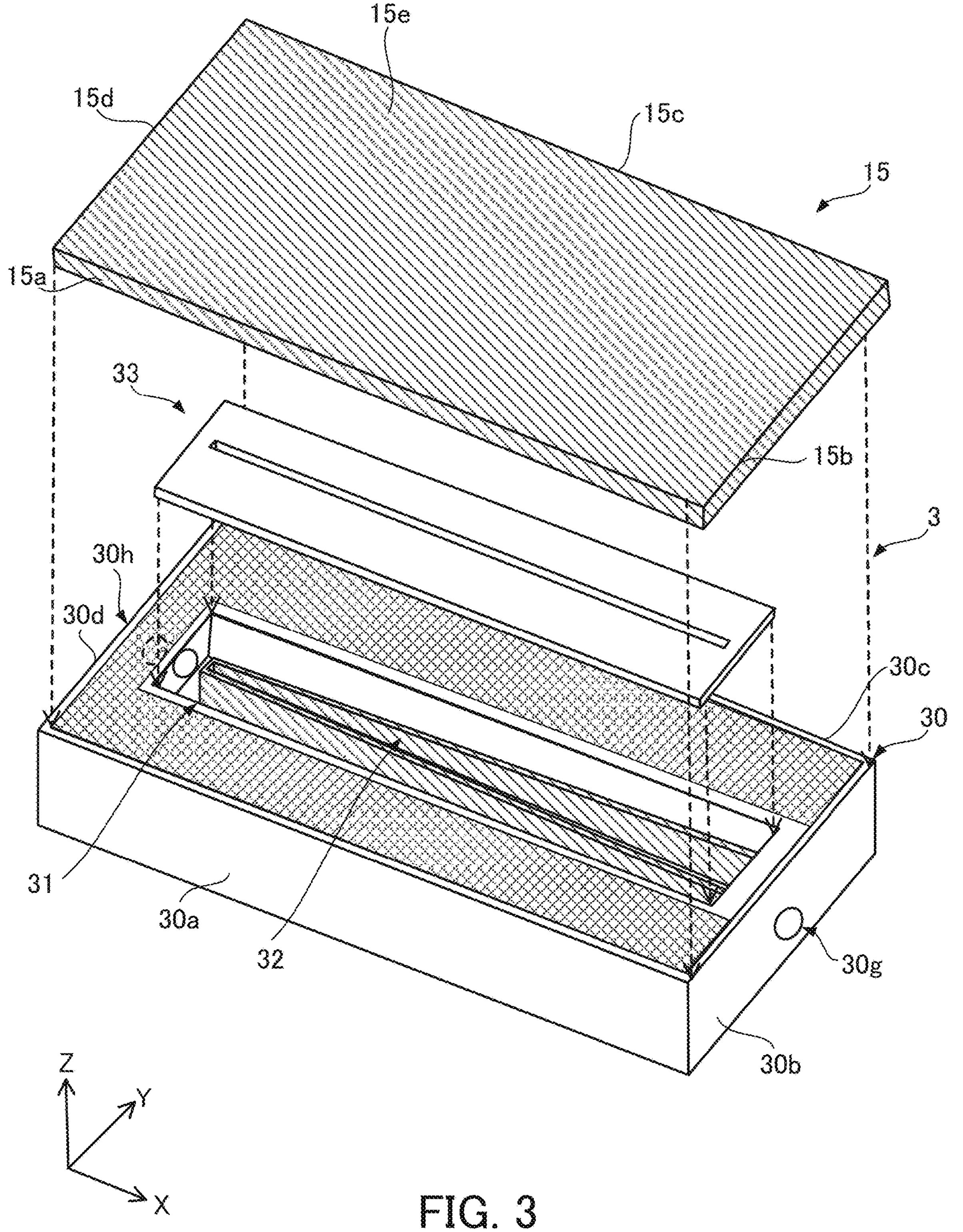
FIG. 3 is an exploded perspective view of a cooling device of the first embodiment.
Figure 4:
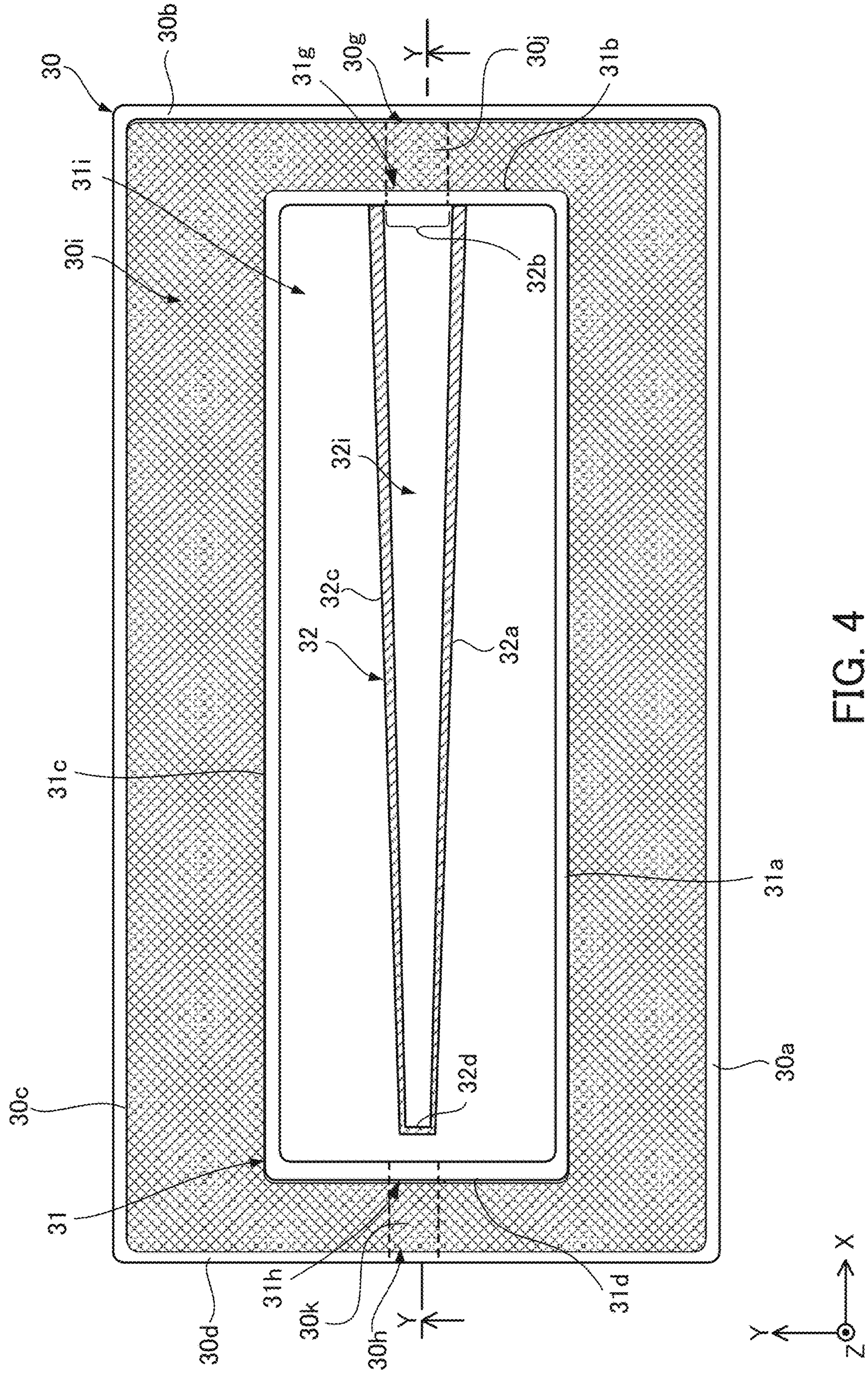
FIG. 4 is a plan view of the cooling device (excluding a guide plate) of the first embodiment.
Figure 5:
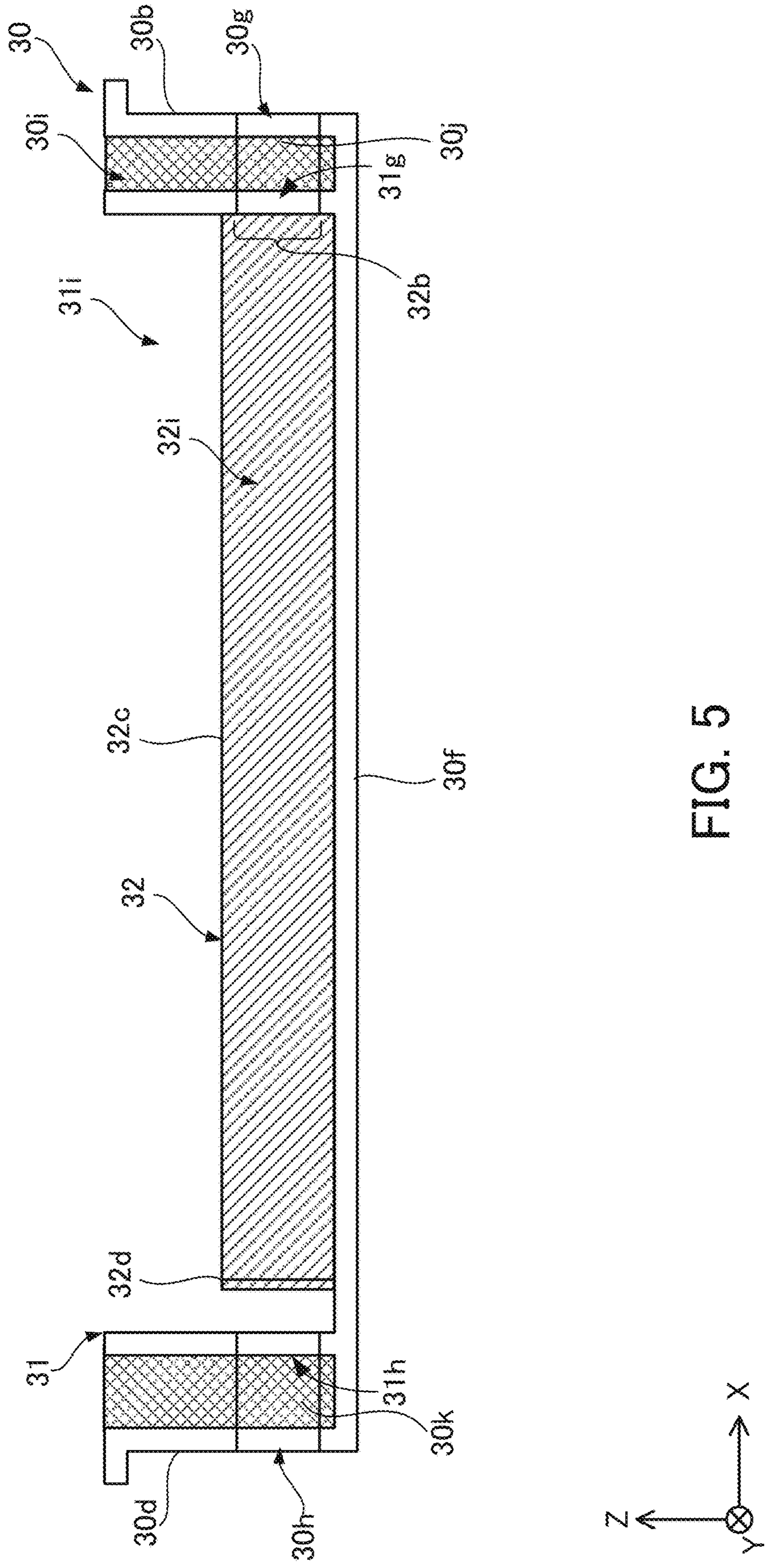
FIG. 5 is a cross-sectional view of the cooling device (excluding the guide plate) of the first embodiment.
Figure 6:
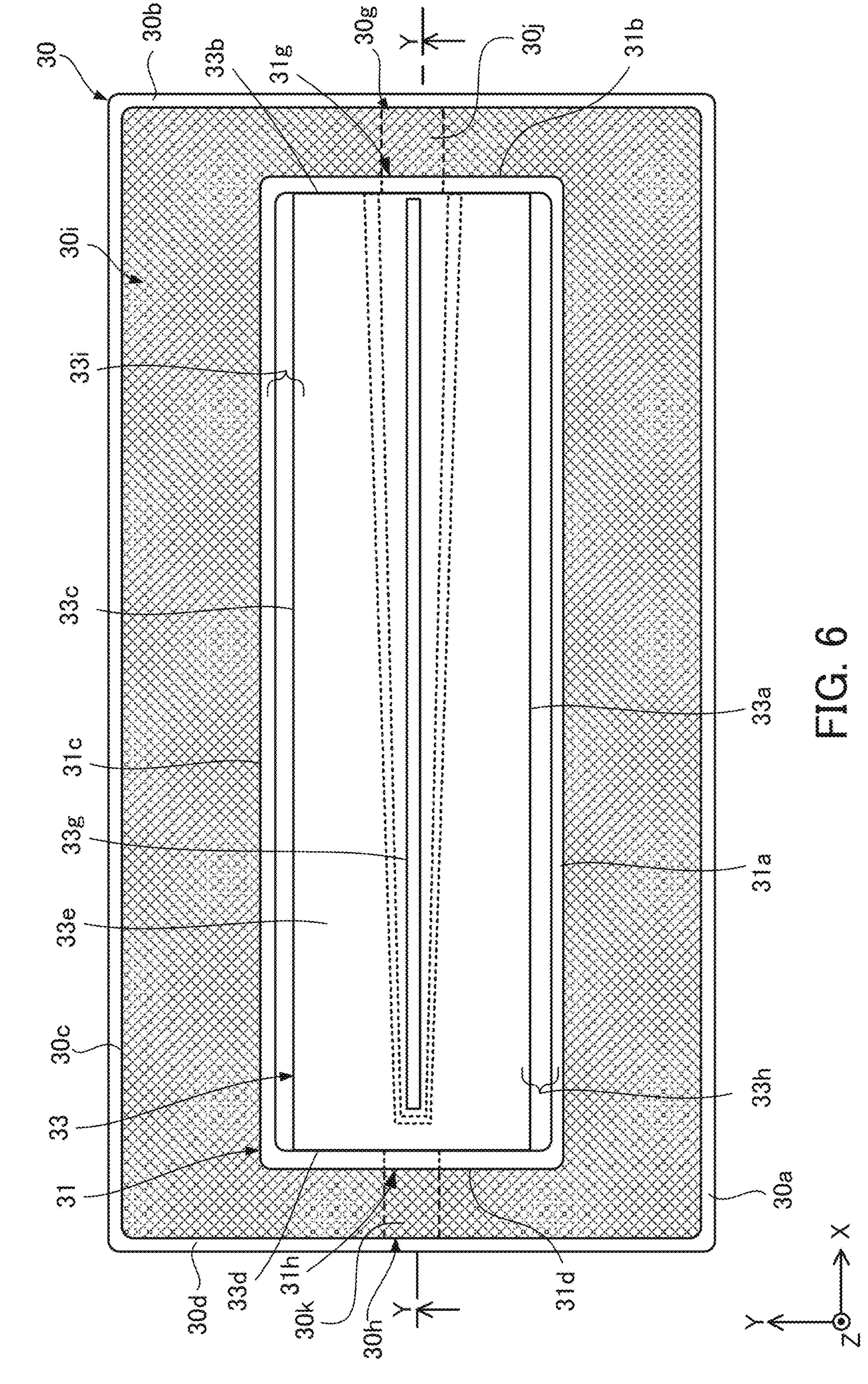
FIG. 6 is another plan view of the cooling device of the first embodiment.
Figure 7:
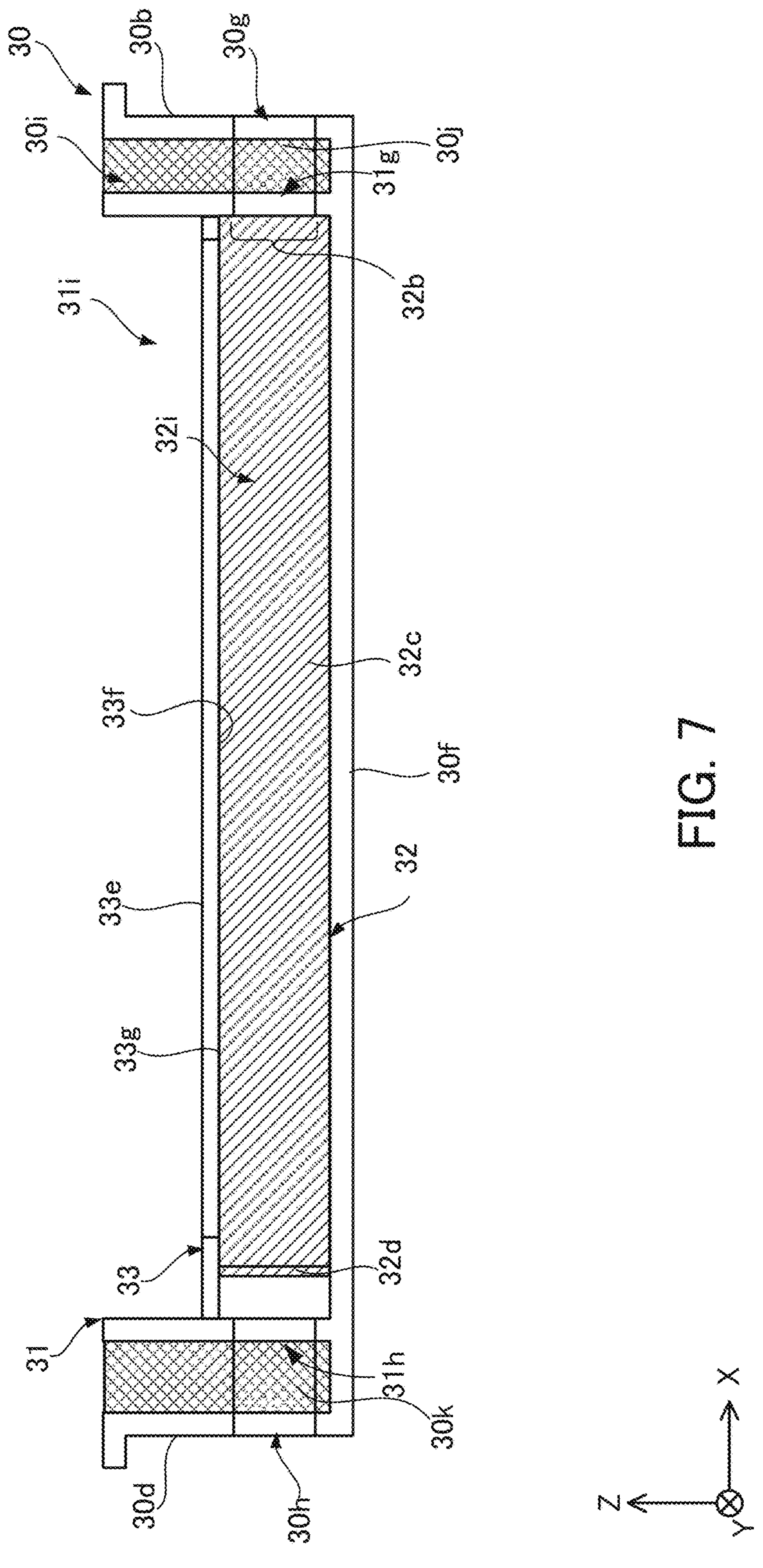
FIG. 7 is another cross-sectional view of the cooling device of the first embodiment.
Figure 8:
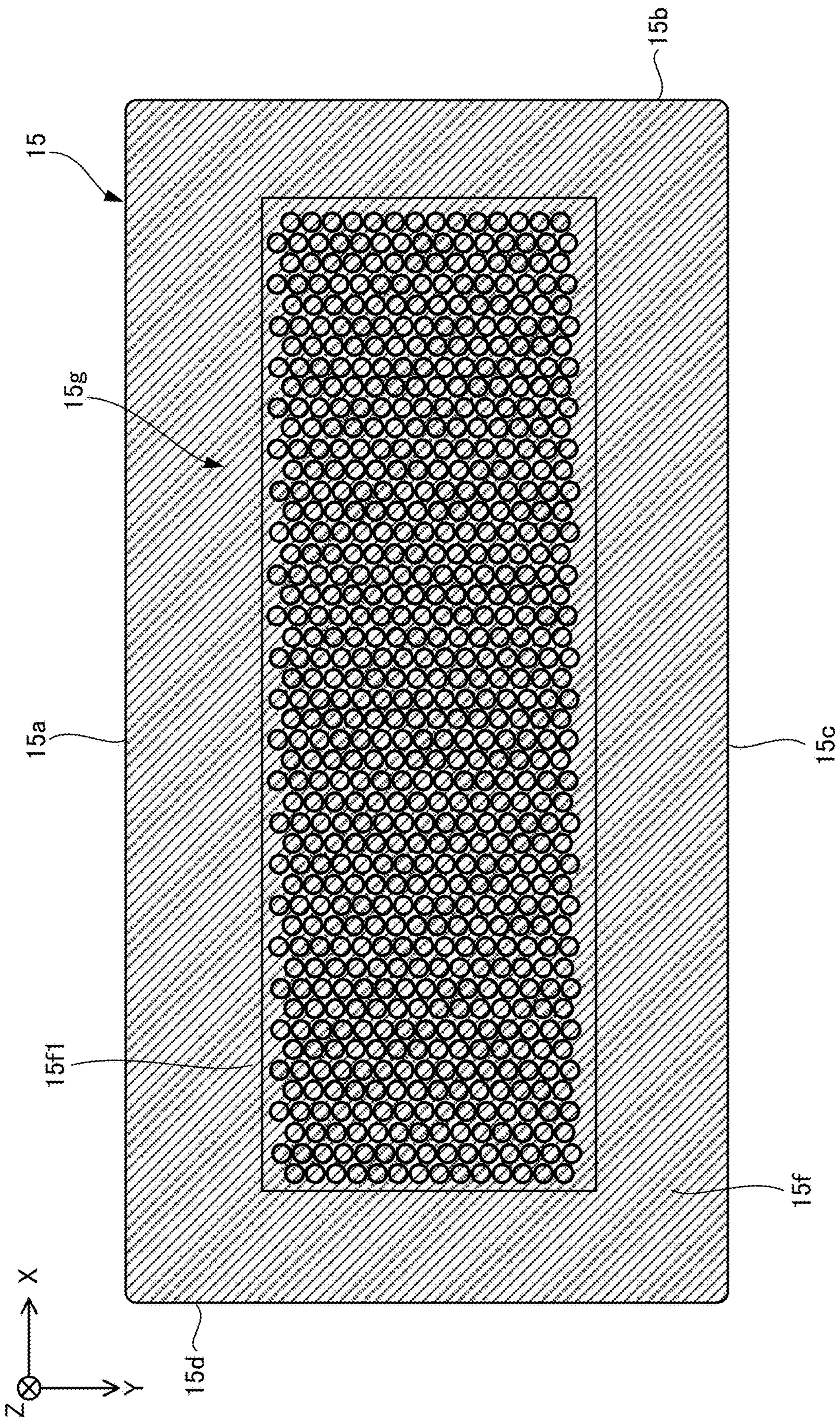
FIG. 8 is a back view of a heat dissipation plate of the first embodiment.
Figure 9:
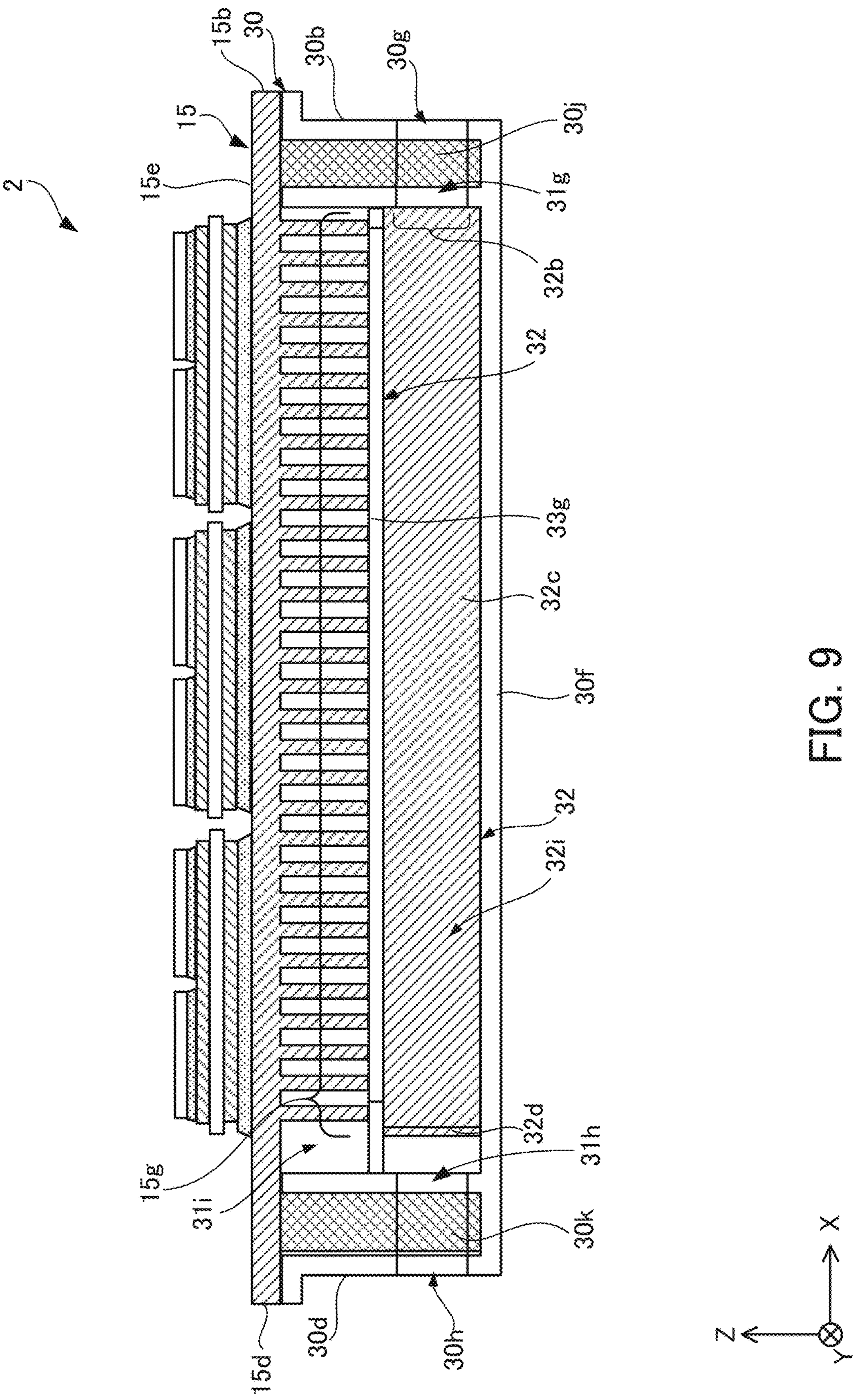
FIG. 9 is a first cross-sectional view of the semiconductor device of the first embodiment.
Figure 10:
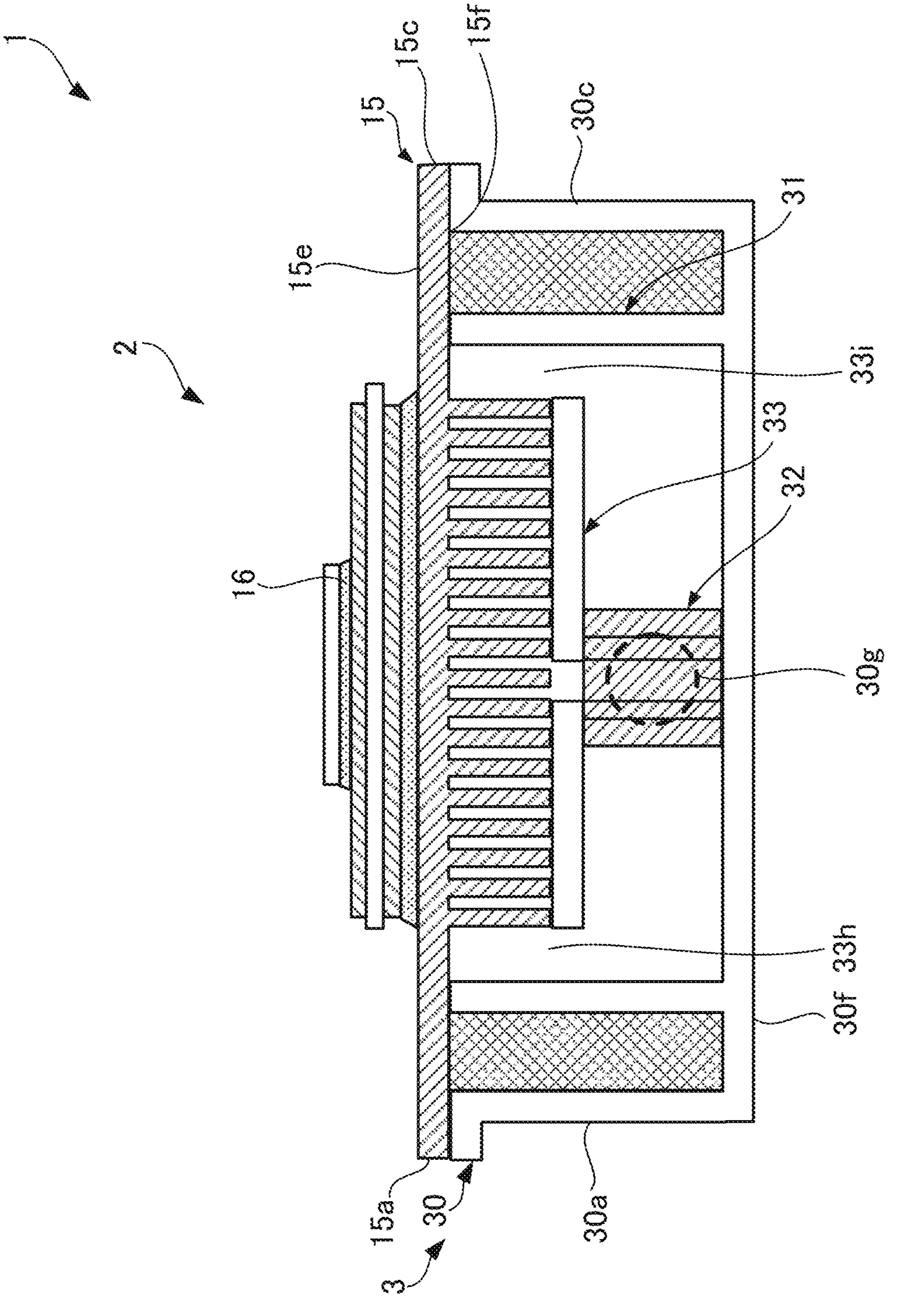
FIG. 10 is a second cross-sectional view of the semiconductor device of the first embodiment.
Figure 10:
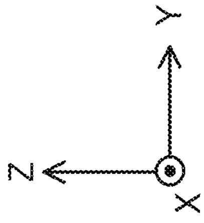

Next described is the cooling device 3, with reference to FIGS. 3 to 10. FIG. 3 is an exploded perspective view of a cooling device of the first embodiment. FIG. 4 is a plan view of the cooling device (excluding a guide plate) of the first embodiment. FIG. 5 is a cross-sectional view of the cooling device (excluding the guide plate) of the first embodiment. FIG. 6 is another plan view of the cooling device of the first embodiment. FIG. 7 is another cross-sectional view of the cooling device of the first embodiment. FIG. 8 is a back view of a heat dissipation plate of the first embodiment. FIG. 9 is a first cross-sectional view of a semiconductor device of the first embodiment. FIG. 10 is a second cross-sectional view of the semiconductor device of the first embodiment.

Note that the cross-sectional view of FIG. 5 is taken along dashed-dotted line Y-Y of FIG. 4. The cross-sectional view of FIG. 7 is taken along dashed-dotted line Y-Y of FIG. 6. The cross-sectional view of FIG. 9 is taken along dashed-dotted line Y-Y of FIG. 1. The cross-sectional view of FIG. 10 is taken along dashed-dotted lines X-X of FIGS. 1 and 2.

The cooling device 3 includes the aforementioned chassis 30, a guide part 32 included in the chassis 30, and a guide plate 33 provided on the guide part 32, as illustrated in FIG. 3. As described above, the chassis 30 includes the bottom plate 30*f*, the long lateral wall 30*a*, the short lateral wall 30*b*, the long lateral wall 30*c*, and the short lateral wall 30*d*, by which a housing area 30*i* is surrounded.

The chassis 30 includes a pool part 31 within the housing area 30*i*, as illustrated in FIGS. 4 and 5. The pool part 31 is provided within the housing area 30*i*, and has a long lateral wall 31*a* (long lateral face), a short lateral wall 31*b* (short lateral face), a long lateral wall 31*c* (long lateral face), and a short lateral wall 31*d* (short lateral face) individually formed on the bottom plate 30*f* (bottom surface). The long lateral wall 31*a*, the short lateral wall 31*b*, the long lateral wall 31*c*, and the short lateral wall 31*d* are disposed on the bottom plate 30*f* to form a rectangular shape in plan view, and define a pool area (pool space) 31*i*. The connection portions between the long lateral wall 31*a*, the short lateral wall 31*b*, the long lateral wall 31*c*, and the short lateral wall 31*d* may have rounded surfaces. Similarly, the connection portions of the long lateral wall 31*a*, the short lateral wall 31*b*, the long lateral wall 31*c*, and the short lateral wall 31*d* to the bottom plate 30*f* may also have rounded surfaces. Thus, provision of the rounded surfaces prevents the refrigerant flowing through the pool part 31 from stagnating at each corner of the pool part 31 and therefore facilitates smooth flow of the refrigerant, as described below.

The long lateral wall 31*a*, the short lateral wall 31*b*, the long lateral wall 31*c*, and the short lateral wall 31*d* of the pool part 31 oppose the long lateral wall 30*a*, the short lateral wall 30*b*, the long lateral wall 30*c*, and the short lateral wall 30*d*, respectively, of the chassis 30. In plan view, the pool area 31*i* is located, within the housing area 30*i*, at the center in each of the ±X direction and the ±Y direction. The long lateral wall 31*a*, the short lateral wall 31*b*, the long lateral wall 31*c*, and the short lateral wall 31*d* of the pool part 31 are the same in height. The heights of the long lateral wall 31*a*, the short lateral wall 31*b*, the long lateral wall 31*c*, and the short lateral wall 31*d* of the pool part 31 are equal to those of the long lateral wall 30*a*, the short lateral wall 30*b*, the long lateral wall 30*c*, and the short lateral wall 30*d* of the chassis 30.

Note that the area of the chassis 30 outside the pool area 31*i* but inside the housing area 30*i* may be sealed with a sealing member. Alternatively, the entire chassis 30 may be configured in a block shape using a sealing member, and a space corresponding to the pool area 31*i* may be opened up inside the chassis 30.

An inlet 31*g* and an outlet 31*h* are formed on the short lateral walls 31*b* and 31*d*, respectively, of the pool part 31. The inlet 31*g* and the outlet 31*h* communicate with a guide area (guide space) 32*i* and the pool area 31*i*, respectively, to be described later. The inlet 31*g* and the outlet 31*h* are arranged in a straight line in the ±X direction with respect to the inlet 30*g* and the outlet 30*h*, respectively, of the chassis 30. That is, the inlets 30*g* and 31*g* oppose one another while the outlets 30*h* and 31*h* oppose one another.

The inlets 30*g* and 31*g* and the outlets 30*h* and 31*h* above may have, for example, a circular shape. The inlets 30*g* and 31*g* and the outlets 30*h* and 31*h* may have the same diameter. The diameter of each of the inlets 30*g* and 31*g* and the outlets 30*h* and 31*h* may be, for example, 20% or more and 70% or less of the width of each of the short lateral walls 31*b* and 31*d* of the pool part 31 in the ±Y direction.

The inlets 30*g* and 31*g* and the outlets 30*h* and 31*h* are positioned, in the #Z direction, at the center of the height (in the ±Z direction) of the guide area 32*i* to be described later. Therefore, the inlets 30*g* and 31*g* and the outlets 30*h* and 31*h* are formed on the short lateral walls 30*b* and 30*d* of the chassis 30 and the short lateral walls 31*b* and 31*d* of the pool part 31 so as to correspond to the above positions.

In addition, the inlets 30*g* and 31*g* are connected by an inflow path 30*j*. Similarly, the outlets 30*h* and 31*h* are connected by an outflow path 30*k*. The inflow path 30*j* and the outflow path 30*k* also form a straight line. The inflow path 30*j* and the outflow path 30*k* may have a cylindrical shape, whose entire inner surface may be substantially flat with no unevenness.

Note that the locations where the outlets 30*h* and 31*h* are formed are not limited to the short lateral walls 30*d* and 31*d*. For example, the outlets 30*h* and 31*h* may be formed, within the pool area 31*i*, at a position in the bottom plate 30*f*, closer to the tip side (in the −X direction) than a tip wall 32*d* of the guide part 32, to be described later. In this case, the outflow path 30*k* penetrates the bottom plate 30*f* in the ±Z direction. Alternatively, the outlet 31*h* may be formed on the short lateral wall 31*d* so as to oppose the inlet 31*g*, and the outlet 30*h* may be formed in the bottom plate 30*f* outside the pool area 31*i* but within the housing area 30*i*. In this case, the outflow path 30*k* may connect the outlets 30*h* and 31*h* within the housing area 30*i*. Furthermore, the locations where the inlets 30*g* and 31*g* are formed are not limited to the short lateral walls 30*b* and 31*b*. For example, the inlets 30*g* and 31*g* may be formed, within the guide area 32*i* to be described later, at a position in the bottom plate 30*f* closer to the short lateral wall 31*b*. In this case, the inflow path 30*j* penetrates the bottom plate 30*f* in the #Z direction. Alternatively, the inlet 31*g* may be formed in the short lateral wall 31*b* so as to oppose the outlet 31*h*, and the inlet 30*g* may be formed in the bottom plate 30*f* outside the pool area 31*i* but within the housing area 30*i*. In this case, the inflow path 30*j* may connect the inlets 30*g* and 31*g* within the housing area 30*i*.

Note that the guide part 32 is provided on the bottom plate 30*f* within the pool area 31*i* of the pool part 31, as illustrated in FIGS. 3 to 5. The guide part 32 has a guide wall 32*a* (first guide wall), the tip wall 32*d*, and a guide wall 32*c* (second guide wall) integrally connected to each other, and includes a first end and a second end. The first end is included in the guide wall 32*a* and connected to the short lateral wall 31*b* of the pool part 31. The second end is included in the guide wall 32*c* and connected to the short lateral wall 31*b* of the pool part 31. The lower ends (the −Z direction) of the guide wall 32*a*, the tip wall 32*d*, and the guide wall 32*c* are connected to the bottom plate 30*f*. The connection portions between the guide wall 32*a*, the tip wall 32*d*, and the guide wall 32*c* may have rounded surfaces. Similarly, the connection portions of the guide wall 32*a*, the tip wall 32*d*, and the guide wall 32*c* to the bottom plate 30*f* may also have rounded surfaces. Thus, provision of the rounded surfaces prevents the refrigerant flowing through the guide part 32 from stagnating at each corner of the guide part 32 and therefore facilitates smooth flow of the refrigerant, as described below.

The guide wall 32*a*, the tip wall 32*d*, and the guide wall 32*c* are the same in height (in the ±Z direction). The heights of the guide wall 32*a*, the tip wall 32*d*, and the guide wall 32*c* (in the ±Z direction) may be lower than those of the chassis 30 and the pool part 31, and may be, for example, about 50% of the heights of the chassis 30 and the pool part 31. In addition, the inner surfaces of the guide wall 32*a*, the tip wall 32*d*, and the guide wall 32*c* may be substantially flat with no unevenness.

A first end of the guide wall 32*a* is connected to the inside of the short lateral wall 31*b* included in the pool part 31. Here, the first end of the guide wall 32*a* is, in plan view, connected to the side of the inlet 31*g* on the short lateral wall 31*b*. The guide wall 32*a* extends from the first end toward the short lateral wall 31*d*. In this regard, as the guide wall 32*a* extends toward the short lateral wall 31*d*, it passes through the center of the short lateral walls 31*b* and 31*d* in plan view and is inclined (to move closer) toward a center line (in FIG. 4, dashed-dotted line Y-Y corresponds to the center line) parallel to the long lateral walls 31*a* and 31*c*.

A second end of the guide wall 32*c* is also connected to the inside of the short lateral wall 31*b* of the pool part 31. Here, the second end of the guide wall 32*c* is connected to a position on the short lateral wall 31*b*, on the opposite side of the inlet 31*g* from the first end of the guide wall 32*a*. That is, the second end of the guide wall 32*c* is connected, within the side of the short lateral wall 31*b*, a position opposite to the first end of the guide wall 32*a* across the inlet 31*g*. The guide wall 32*c* extends from the second end toward the short lateral wall 31*d*. In this regard, the guide wall 32*c* is inclined (to move closer) toward the center line (in FIG. 4, dashed-dotted line Y-Y corresponds to the center line) as it extends toward the short lateral wall 31*d*.

The tip wall 32*d* is connected to the tips (in the −X direction) of the guide walls 32*a* and 32*c*. The tip wall 32*d* opposes the short lateral wall 31*d* of the pool part 31. That is, the tip wall 32*d* is parallel to the short lateral wall 31*d* of the pool part 31. Further, the tip wall 32*d* is disposed with a gap from the short lateral wall 31*d* of the pool part 31. In plan view, the tip wall 32*d* is located, in the ±Y direction, at the center of each of the short lateral walls 31*b* and 31*d* of the pool part 31. The width of the tip wall 32*d* in plan view (in the ±Y direction) is smaller than the length, on the short lateral wall 31*b*, between the position to which the first end of the guide wall 32*a* is connected and the position to which the second end of the guide wall 32*c* is connected. Further, the width of the tip wall 32*d* in plan view (in the ±Y direction) is smaller than the diameter of the inlet 31*g*.

In addition, an inlet 32*b* is formed between the first end of the guide wall 32*a* and the second end of the guide wall 32*c* of the guide part 32. The width (in the ±Y direction) of the inlet 32*b* may be approximately the same as the diameter of the inlet 31*g* but is larger than that of the inlet 31*g*.

Providing the guide part 32 in the pool part 31 in the above-described manner creates the guide area 32*i* surrounded by the guide part 32 and the short lateral wall 31*b*. In addition, the guide part 32 defines the guide area 32*i* and the pool area 31*i* outside the guide area 32*i*. Note that the inlet 32*b* of the guide part 32 communicates with the guide area 32*i*. Therefore, a passage is formed from the inlet 30*g* to the guide area 32*i*, passing through the inflow path 30*j* and the inlets 31*g* and 32*b*.

The guide plate 33 has a flat plate shape, and includes a front surface 33*e* being rectangular in plan view; a rear surface 33*f* opposite to the front surface 33*e*; and a long lateral face 33*a*, a short lateral face 33*b*, a long lateral face 33*c*, and a short lateral face 33*d* surrounding in order all four sides of the front surface 33*e* and the rear surface 33*f*, as illustrated in FIGS. 3, 6, and 7. The guide plate 33 is disposed on the guide part 32 within the pool part 31. The lengths of the long lateral faces 33*a* and 33*c* of the guide plate 33 in the ±X direction are the same as the length of the pool part 31 in the same direction. The widths of the short lateral faces 33*b* and 33*d* of the guide plate 33 in the ±Y direction are less than the width of the pool part 31 in the same direction. When the guide plate 33 with the above configuration is placed on the guide part 32, first and second collection gaps 33*h* and 33*i* are formed, in plan view, between the long lateral faces 33*a* and 33*c* of the guide plate 33 and the long lateral walls 31*a* and 31*c*, respectively, of the pool part 31. Note that the widths of the first and second collection gaps 33*h* and 33*i* in the ±Y direction may be, for example, 1 mm.

In addition, the guide plate 33 is provided with a guide slit 33*g* (slit) that penetrates the guide plate 33 from the front surface 33*e* to the rear surface 33*f*. The guide slit 33*g* is formed on the guide plate 33 in such a manner that, when the guide plate 33 is placed on the guide part 32, the guide slit 33*g* overlaps the guide area 32*i* in plan view and extends in a straight line from the inlet 32*b* toward the tip wall 32*d* to just before the tip wall 32*d*. In addition, the guide slit 33*g* is formed on the guide plate 33 in such a manner as to be laid on a center line (corresponding to dashed-dotted line Y-Y of FIG. 6) passing through the individual centers of the inlet 32*b* and the tip wall 32*d* of the guide part 32 in plan view when the guide plate 33 is placed on the guide part 32. The width (in the ±Y direction) of the guide slit 33*g* is, in plan view, ⅙ or more and ⅕ or less of the width of the inlet 32*b* in the same direction. In the case of the first embodiment, the width of the guide slit 33*g* may be, for example, 2 mm or more and 4 mm or less, and may be specifically 2 mm.

The guide area 32*i* surrounded by the above-described guide part 32, bottom plate 30*f*, and guide plate 33 becomes smaller as it moves away from the inlet 32*b* when viewed in the inflow direction from the inlet 32*b* of the guide part 32 toward the guide area 32*i*. The guide part 32 and the bottom plate 30*f* are formed so as to provide the guide area 32*i* with this configuration.

Next described is the heat dissipation plate 15, to the rear surface 15*f* of which the cooling device 3 is joined. The heat dissipation plate 15 includes the front surface 15*e* having a rectangular shape in plan view, the rear surface 15*f*, the long lateral face 15*a*, the short lateral face 15*b*, the long lateral face 15*c*, and the short lateral face 15*d*, as described above. The heat dissipation plate 15 has multiple fins 15*g* formed in a region of the rear surface 15*f* (a cooling area 15*f*1) corresponding to the unit area 15*e*1 of the front surface 15*e*, as illustrated in FIG. 8. Each of the fins 15*g* has a columnar shape. The columnar shape may be a cylindrical or polygonal column. The multiple fins 15*g* are formed perpendicular to the rear surface 15*f* of the heat dissipation plate 15.

The heat dissipation plate 15 with the above configuration is placed in the chassis 30, with the semiconductor unit 2 disposed on the front surface 15*e*, as illustrated in FIGS. 9 and 10. At this time, the rear surface 15*f* of the heat dissipation plate 15 is placed on the pool part 31, and the multiple fins 15*g* of the heat dissipation plate 15 are accommodated in the pool area 31*i* over the guide plate 33 within the pool part 31. That is, the multiple fins 15*g* of the heat dissipation plate 15 are surrounded by the guide plate 33 on the back side (in the −Z direction), and also surrounded on all sides by the long lateral wall 31*a*, the short lateral wall 31*b*, the long lateral wall 31*c*, and the short lateral wall 31*d* in this order.

Figure 11:
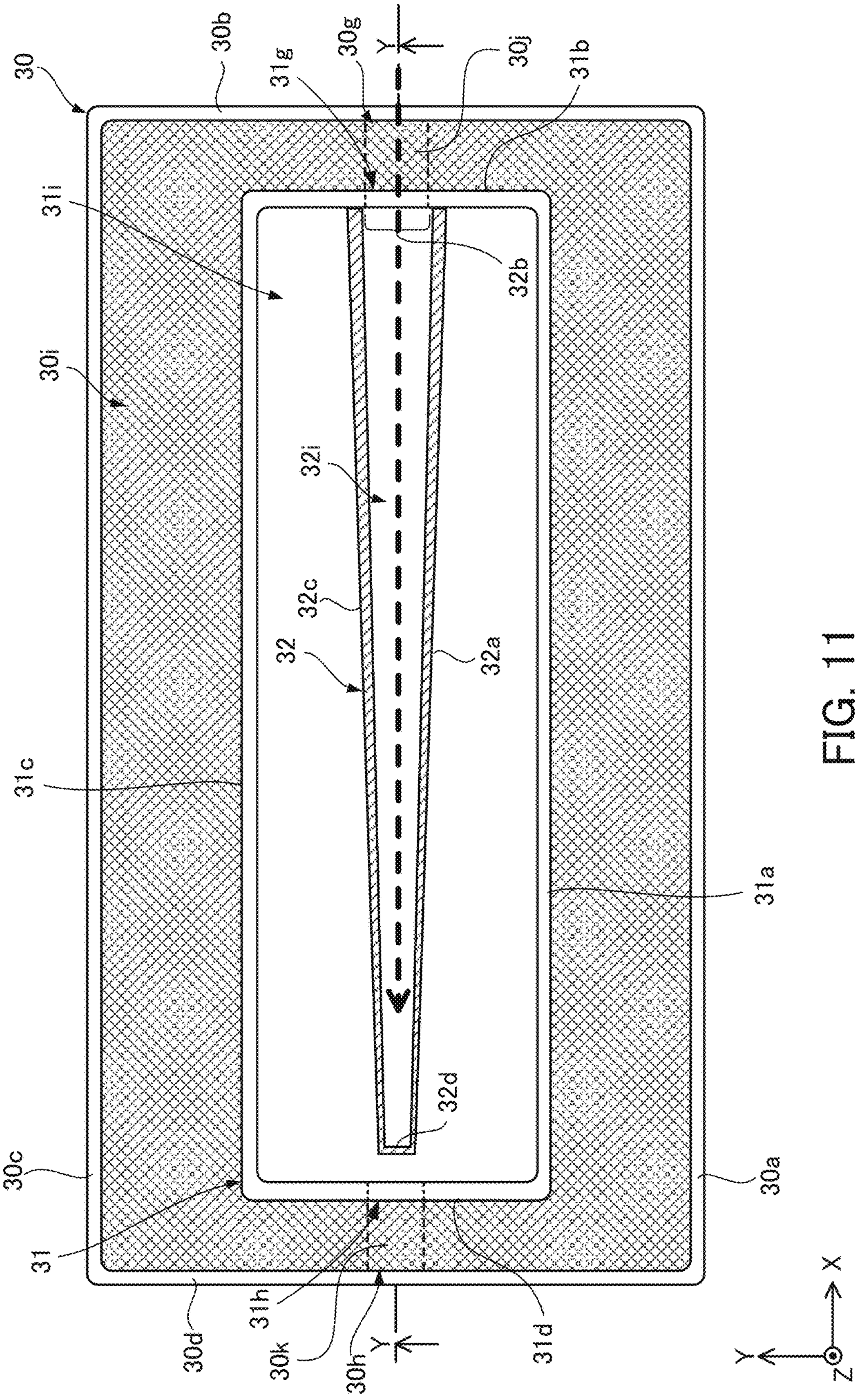
FIG. 11 is a first plan view illustrating a refrigerant flow in the cooling device of the first embodiment.
Figure 12:
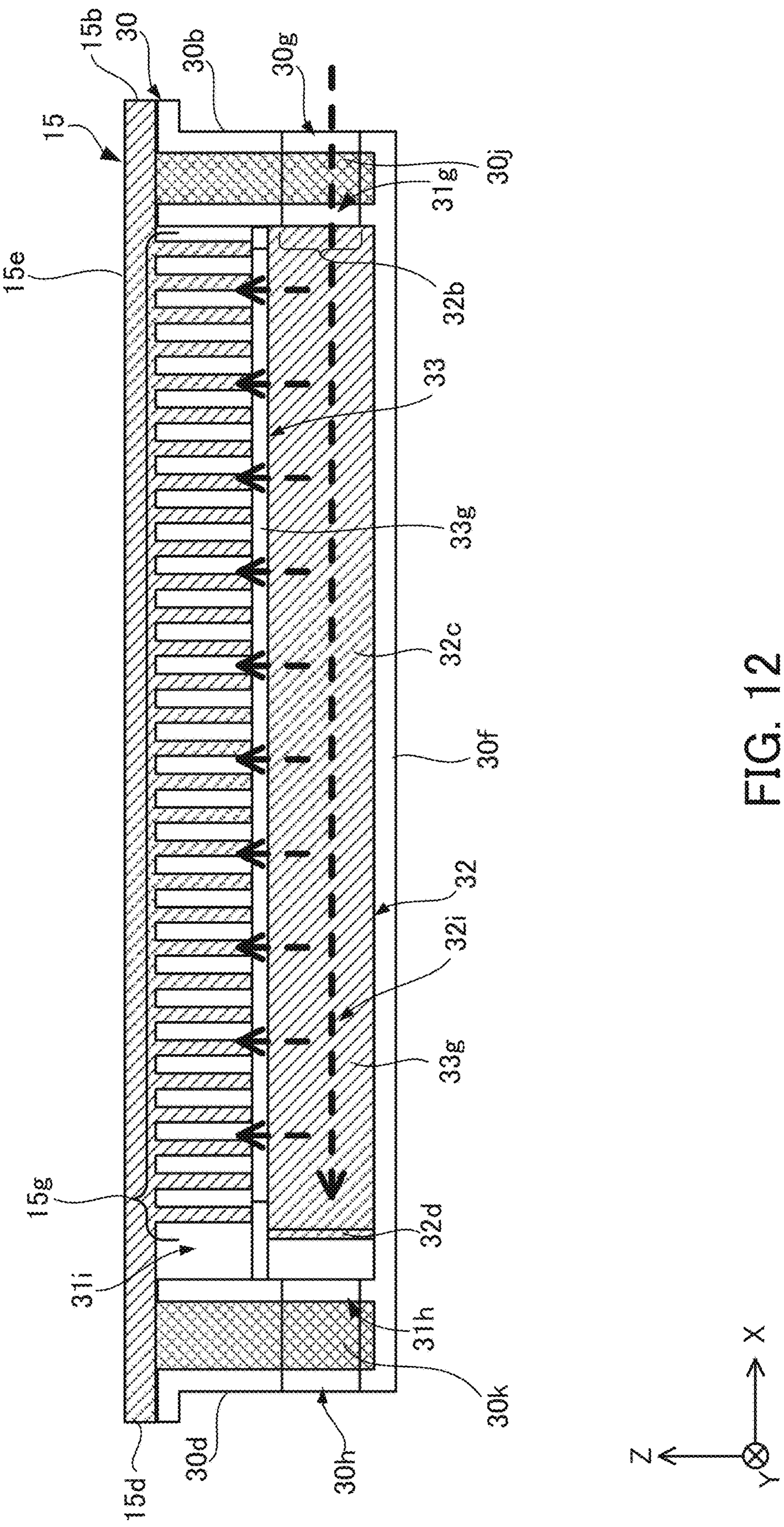
FIG. 12 is a first cross-sectional view illustrating the refrigerant flow in the cooling device of the first embodiment.
Figure 13:
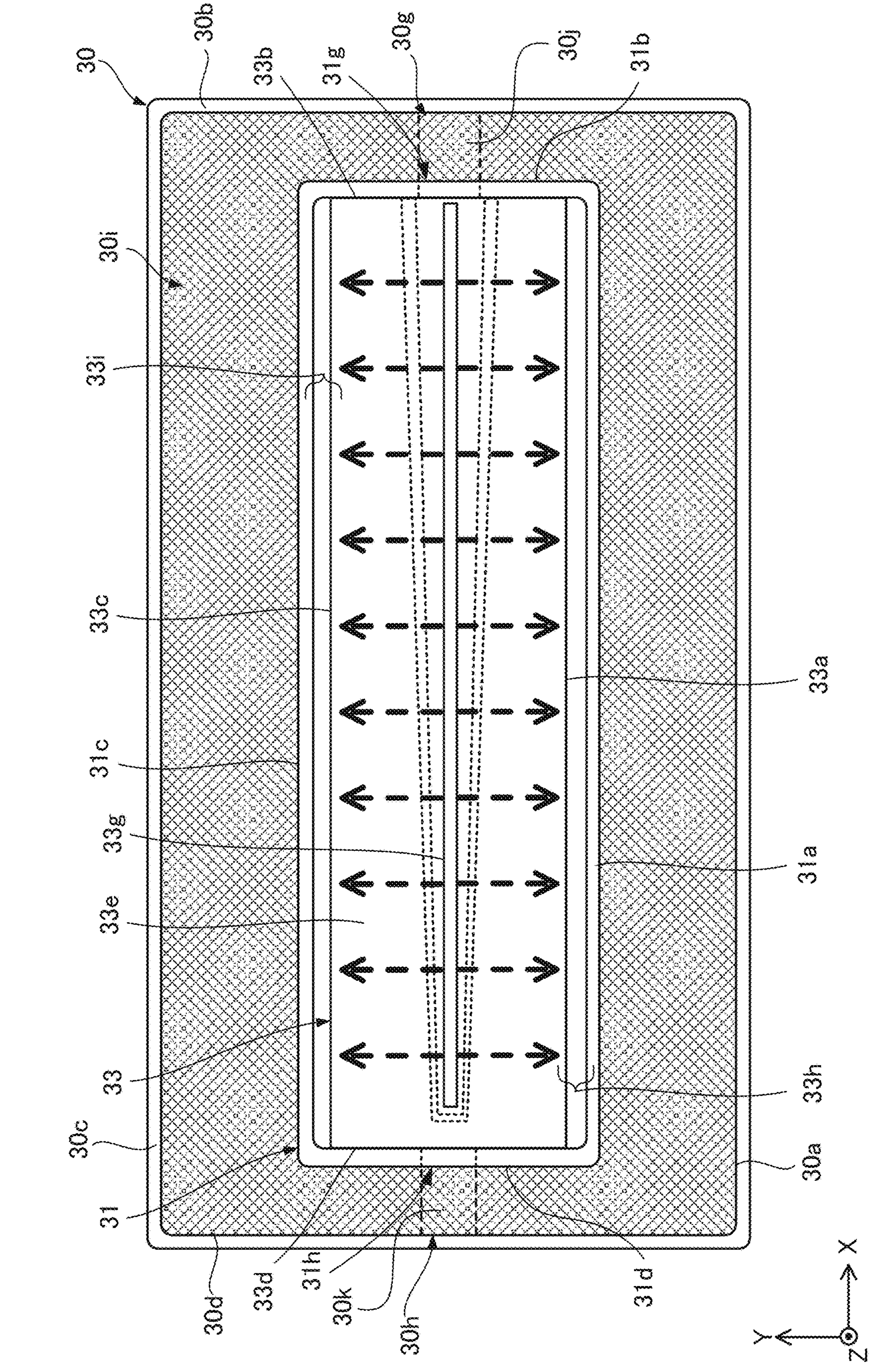
FIG. 13 is a second plan view illustrating the refrigerant flow in the cooling device of the first embodiment.
Figure 14:
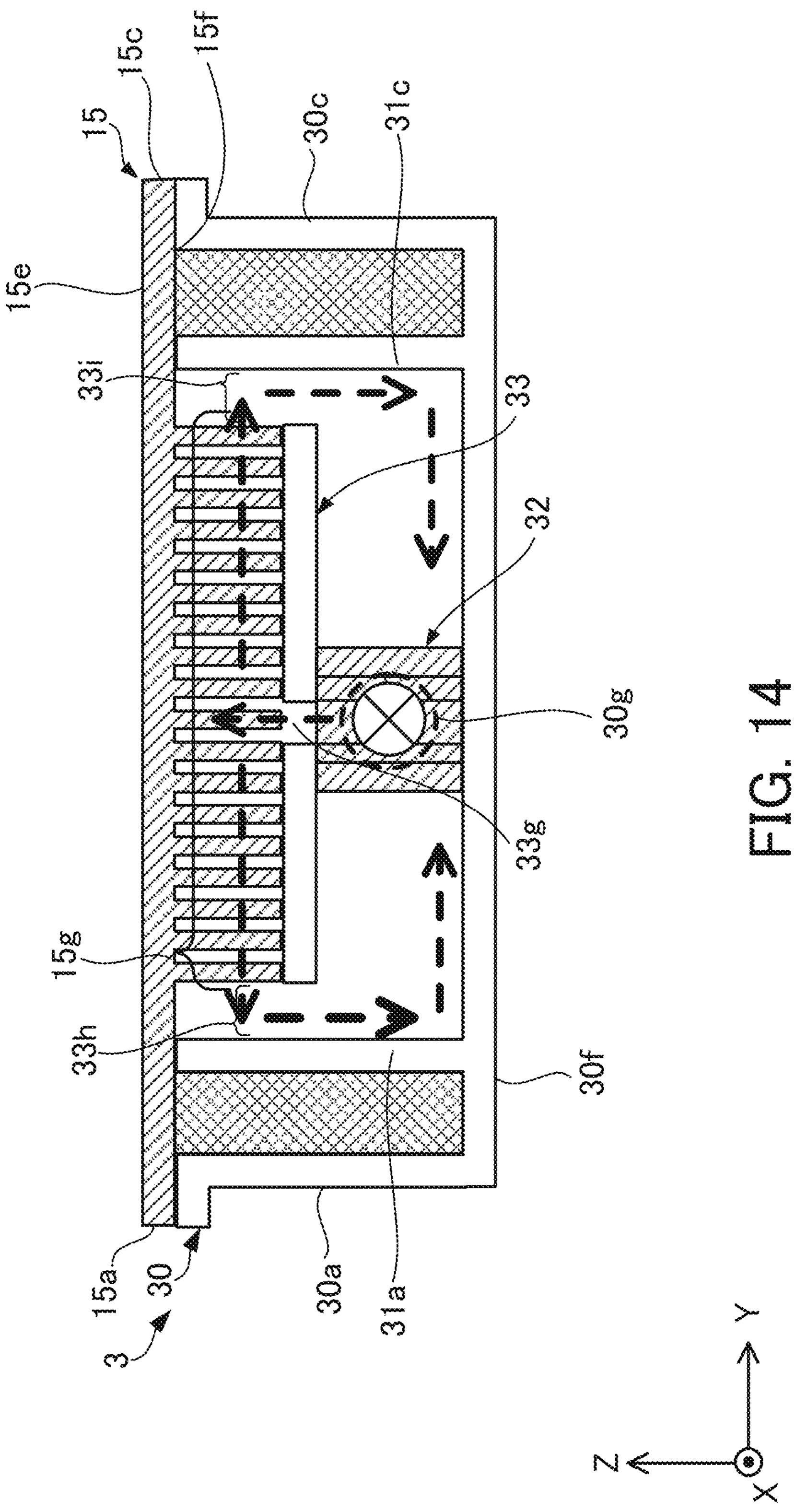
FIG. 14 is a second cross-sectional view illustrating the refrigerant flow in the cooling device of the first embodiment.
Figure 15:
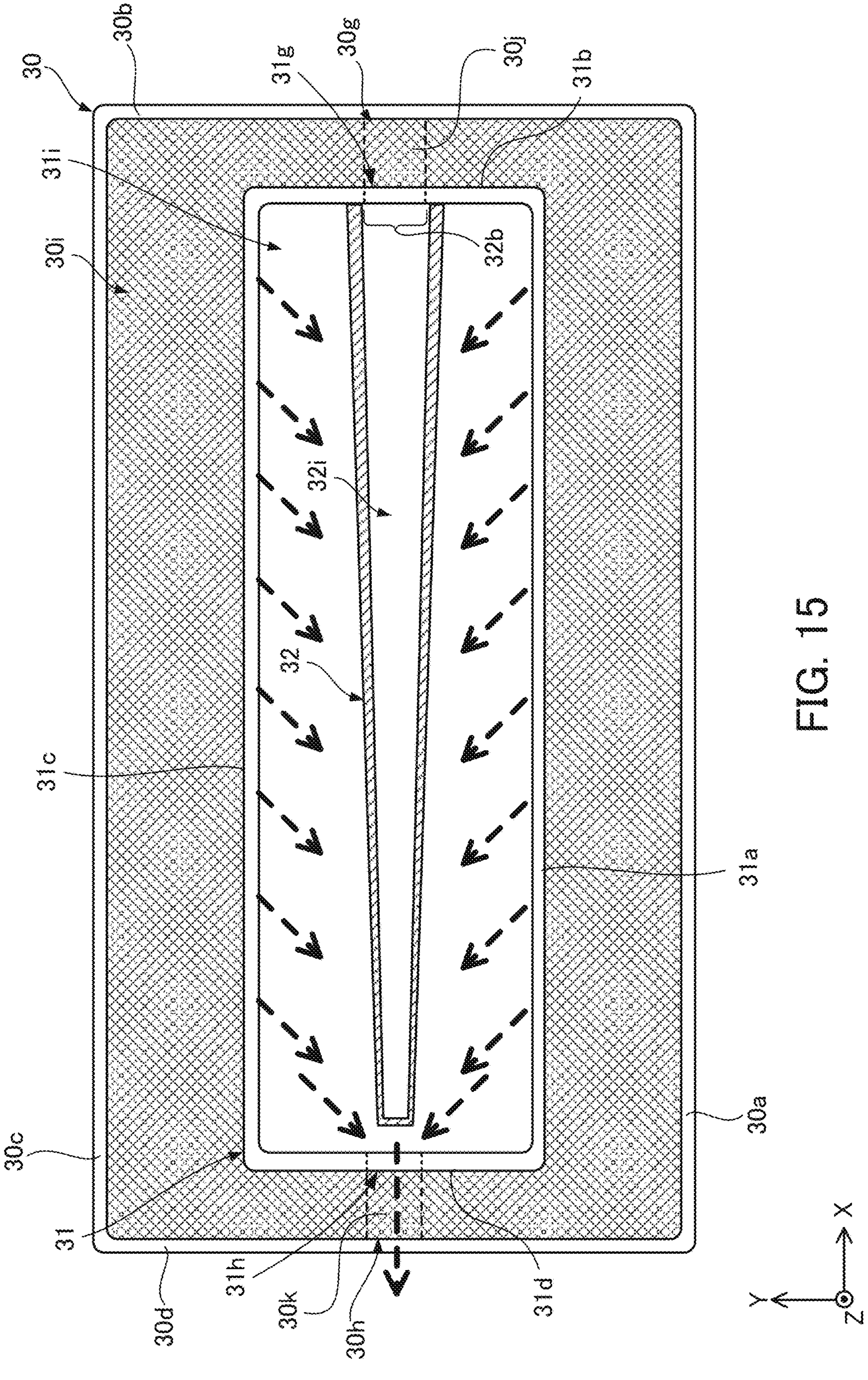
FIG. 15 is a third plan view illustrating the refrigerant flow in the cooling device of the first embodiment.

Next described is the flow of the refrigerant in the cooling device 3, with reference to FIGS. 11 to 15. FIG. 11 is a first plan view illustrating the flow of the refrigerant in the cooling device of the first embodiment. FIG. 12 is a first cross-sectional view illustrating the flow of the refrigerant in the cooling device of the first embodiment. FIG. 13 is a second plan view illustrating the flow of the refrigerant in the cooling device of the first embodiment. FIG. 14 is a second cross-sectional view illustrating the flow of the refrigerant in the cooling device of the first embodiment. FIG. 15 is a third plan view illustrating the flow of the refrigerant in the cooling device of the first embodiment.

Note that in the above diagrams, the flow of the refrigerant is indicated by broken arrows. In addition, illustration of the heat dissipation plate 15 and the guide plate 33 is omitted from the diagrams as appropriate for explanation of the flow of the refrigerant. Note that the cross-sectional view of FIG. 12 is taken along dashed-dotted line Y-Y of FIG. 11. FIG. 14 is a perspective side view of FIG. 13, viewed in the −X direction.

First, the refrigerant is introduced from the inlet 30*g* of the cooling device 3 using a pump. The refrigerant flowing in from the inlet 30*g* passes through the inflow path 30*j*, enters the guide area 32*i* from the inlets 31*g* and 32*b*, and travels straight in the −X direction, as illustrated in FIGS. 11 and 12. When the refrigerant fills the guide area 32*i* to some extent, the refrigerant flows out from the guide slit 33*g* of the guide plate 33 to the outside of the guide plate 33.

The guide area 32*i* becomes smaller as it moves away from the inlet 32*b* when viewed in the inflow direction from the inlet 32*b* toward the guide area 32*i*. This configuration allows the pressure difference in the refrigerant having entered the guide area 32*i* between the tip wall 32*d* side and the inlet 32*b* side to be reduced, which facilitates the refrigerant to flow out also from a part of the guide slit 33*g* near the inlet 32*b*. Therefore, the refrigerant having flowed into the guide area 32*i* flows out substantially uniformly from the entire guide slit 33*g*.

The refrigerant having flowed into the pool area 31*i* over the guide plate 33 from the guide slit 33*g* passes through the multiple fins 15*g* toward the first and second collection gaps 33*h* and 33*i* provided along the long lateral faces 33*a* and 33*c* of the guide plate 33, as illustrated in FIG. 13. The refrigerant flowing through the fins 15*g* receives heat conducted from the semiconductor unit 2 through the heat dissipation plate 15 and the fins 15*g*.

The refrigerant having flowed from the guide slit 33*g* toward the first and second collection gap 33*h* and 33*i* flows from the first and second collection gaps 33*h* and 33*i* into the pool area 31*i*, which is surrounded by the guide plate 33, the long lateral wall 31*a*, the short lateral wall 31*b*, the long lateral wall 31*c*, and the short lateral wall 31*d*, as illustrated in FIG. 14.

The refrigerant having flowed into the pool area 31*i* below the guide plate 33 flows through the pool area 31*i* outside the guide area 32*i* toward the outlet 30*h*, and then flows out from the outlet 30*h*, as illustrated in FIG. 15.

The radiator receives the refrigerant flowing out from the cooling device 3 in the above-described manner, and dissipates heat contained in the refrigerant to the outside. The pump causes the refrigerant after heat dissipation to flow into the cooling device 3 again through the inlet 30*g*.

Figure 16:
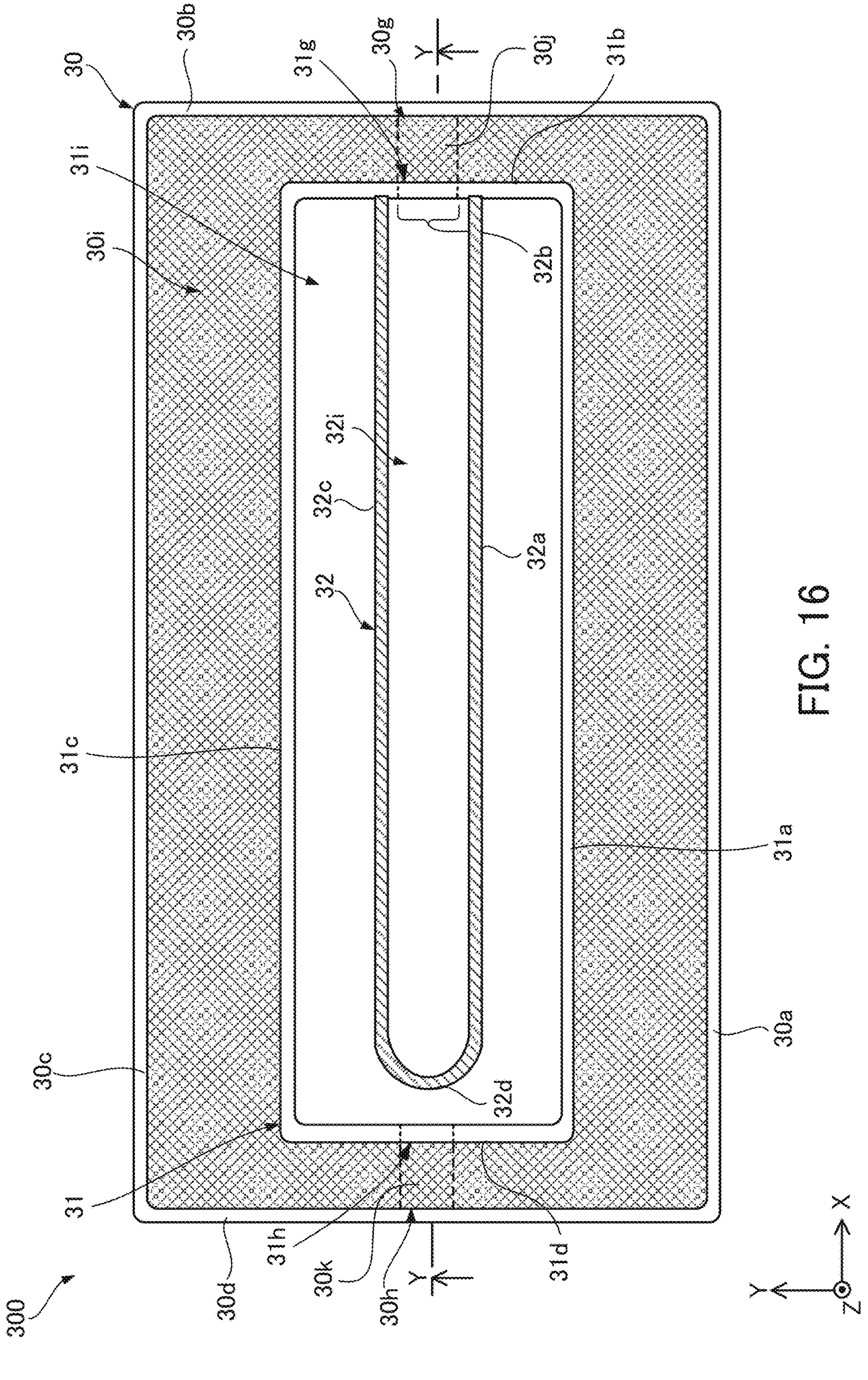
FIG. 16 is a plan view of a cooling device (excluding a guide plate) of a reference example.
Figure 17:
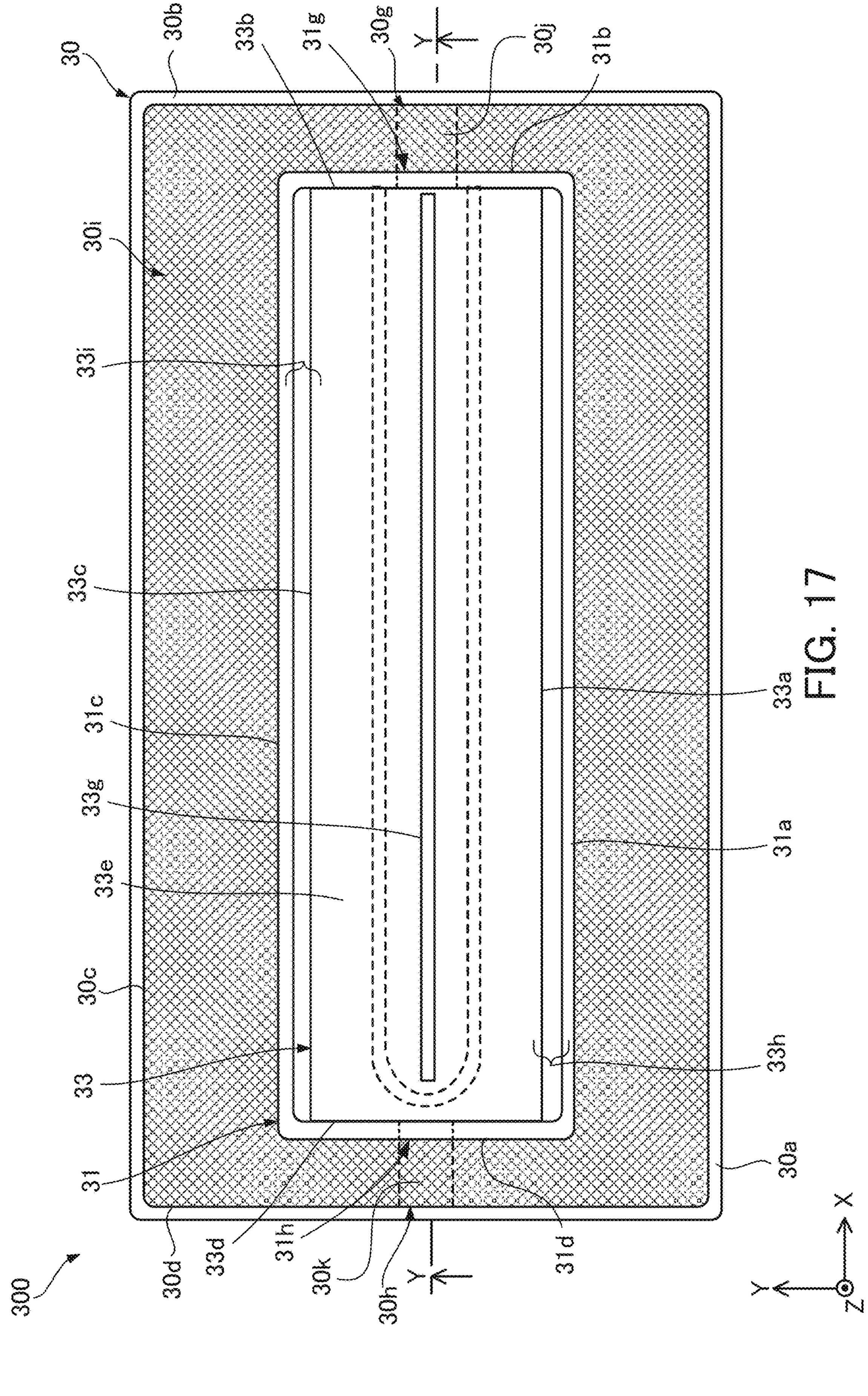
FIG. 17 is another plan view of the cooling device of the reference example.

Here, a cooling device of a reference example is explained using FIGS. 16 and 17. FIG. 16 is a plan view of the cooling device (excluding a guide plate) of the reference example. FIG. 17 is another plan view of the cooling device of the reference example. Note that the plan view of FIG. 16 depicts a cooling device 300 without the guide plate 33.

The cooling device 300 of the reference example differs from the cooling device 3 of the first embodiment in the guide part 32. In the guide part 32 of the cooling device 300, the guide wall 32*a*, the tip wall 32*d*, and the guide wall 32*c* are integrally connected to each other. Note that, in the reference example, the guide walls 32*a* and 32*c* are provided parallel to the long lateral walls 31*a* and 31*c* of the pool part 31, as illustrated in FIG. 16. In addition, in the reference example, the tip wall 32*d* connects the tip sides (in the −X direction) of these guide walls 32*a* and 32*c*. The tip wall 32*d* is arc-shaped, bulging toward the short lateral wall 31*d*.

Similarly to the first embodiment, when the guide plate 33 is placed on the guide part 32, the first and second collection gaps 33*h* and 33*i* are formed, in plan view, between the long lateral faces 33*a* and 33*c* of the guide plate 33 and the long lateral walls 31*a* and 31*c* of the pool part 31. In addition, as illustrated in FIG. 17, the guide slit 33*g* is formed on the guide plate 33 in such a manner as to be laid on a center line (corresponding to dashed-dotted line Y-Y of FIG. 17) passing through the individual centers of the inlet 32*b* and the tip wall 32*d* of the guide part 32 in plan view when the guide plate 33 is placed on the guide part 32. In this reference example, the guide area 32*i* surrounded by the bottom plate 30*f*, the guide part 32, and the guide plate 33 has a substantially cubic shape.

When the refrigerant flows s into the cooling device 300 with the above configuration from the inlet 30*g*, it passes through the inflow path 30*j* and enters the guide area 32*i* from the inlets 31*g* and 32*b*, as in the first embodiment. When filling the guide area 32*i* to some extent, the refrigerant starts flowing out from the guide slit 33*g* of the guide plate 33 to the outside of the guide plate 33.

At this time, if the width of the guide slit 33*g* is narrow (for example, about 1 mm), the refrigerant is able to uniformly flow out from the entire guide slit 33*g*. However, the guide slit 33*g* being thin leads to increased pressure drop in the refrigerant. This in turn results in, for example, an increased cost of driving the pump.

On the other hand, when the width of the guide slit 33*g* is wide (for example, about 2 mm), the refrigerant fails to uniformly flow out from the entire guide slit 33*g*.

In the reference example, the guide area 32*i* hardly changes even if it moves away from the inlet 32*b* when viewed in the inflow direction from the inlet 31*g* (the inlet 32*b*) of the pool part 31 to the guide area 32*i*. The pressure of the refrigerant flowing into the guide area 32*i* increases as it approaches the tip wall 32*d* of the guide area 32*i*. The flow velocity of the refrigerant is reduced, in plan view, on the inlet 32*b* side of the guide slit 33*g* than on the tip wall 32*d* side.

Therefore, the flow velocity of the refrigerant flowing out from the guide slit 33*g* is higher on the tip wall 32*d* side than on the inlet 32*b* side. As a result, heat dissipation performance on the front surface 15*e* of the heat dissipation plate 15 varies depending on the position. That is, the heat dissipation of the front surface 15*e* of the heat dissipation plate 15 is lower on the inlet 30*g* (the inlet 32*b*) side compared to the outlet 30*h* (the tip wall 32*d*) side. This causes variations in the heat dissipation performance for the semiconductor chips 14 included in the semiconductor unit 2 on the front surface 15*e* of the heat dissipation plate 15. The variations in the heat dissipation performance for the semiconductor unit 2 lead to reduced reliability of the semiconductor device 1. Details of the heat dissipation performance is described later.

In view of the above problem, the semiconductor device 1 of the first embodiment includes the semiconductor chips 14, the heat dissipation plate 15, and the cooling device 3. The heat dissipation plate 15 includes the front surface 15*e* having the unit area 15*e*1 on which the semiconductor chips 14 are arranged; the rear surface 15*f* with the cooling area 15*f*1 corresponding to the unit area 15*e*1; and the multiple fins 15*g* installed in the cooling area 15*f*1.

The cooling device 3 is provided on the rear surface 15*f* of the heat dissipation plate 15, and includes the pool part 31, the guide part 32, and the guide plate 33. The pool part 31 has the pool area 31*i* surrounded and defined, in plan view, by the rectangular bottom plate 30*f*, the paired long lateral walls 31*a* and 31*c*, and the paired short lateral walls 31*b* and 31*d*. The pool part 31 is also provided with the inlet 31*g* on one of the short lateral walls 31*b* and 31*d* (in this example, the short lateral wall 31*b*).

The guide part 32 is formed on the bottom plate 30*f* in such a manner that the first end thereof is connected to the inner side of the short lateral wall 31*b* while the second end is connected to a position on the short lateral wall 31*b*, opposite to the first end across the inlet 31*g* so as to separate the guide area 32*i* communicating with the inlet 31*g* from the pool area 31*i* outside the guide area 32*i*.

The guide plate 33 is disposed on the guide part 32 with the first and second collection gaps 33*h* and 33*i* from the long lateral walls 31*a* and 31*c*, respectively, within the pool area 31*i*, and has a flat plate shape with the guide slit 33*g*, which extends from the short lateral wall 31*b* toward the short lateral wall 31*d* within an area overlapping the guide area 32*i*.

When the cooling device 3 is attached to the rear surface 15*f* of the heat dissipation plate 15, the multiple fins 15*g* are housed in the pool area 31*i* over the guide plate 33. In the cooling device 3 with the above configuration, the guide part 32 is further configured in such a manner that the guide area 32*i* thereof becomes smaller as it moves away from the inlet 31*g* of the pool part 31 when viewed in the inflow direction from the inlet 31*g* toward the guide area 32*i*.

The above configuration allows the pressure difference in the refrigerant having entered the guide area 32*i* between the tip wall 32*d* side and the inlet 32*b* side to be reduced, which facilitates the refrigerant to flow out also from the part of the guide slit 33*g* near the inlet 32*b*. Therefore, the refrigerant having flowed into the guide area 32*i* flows out substantially uniformly from the entire guide slit 33*g*. This in turn reduces variations in the heat dissipation performance depending on the position on the front surface 15*e* of the heat dissipation plate 15, and thus uniformly cools the semiconductor unit 2. The reduced pressure drop enables a reduction in the cost of driving the pump and also reduces the loss of reliability of the semiconductor device 1.

(b) Second Embodiment

The guide part 32 needs to be configured in such a manner that the guide area 32*i* surrounded by the guide part 32, the bottom plate 30*f*, and the guide plate 33 becomes smaller as it moves away from the inlet 31*g* of the pool part 31 when viewed in the inflow direction from the inlet 31*g* toward the guide area 32*i*. In the first embodiment, the guide walls 32*a* and 32*c* of the guide part 32 are inclined so as to come closer to a center line, which passes through the center of each of the short lateral walls 31*b* and 31*d*, as they move away from the short lateral wall 31*b* toward the short lateral wall 31*d*.

Figure 18:
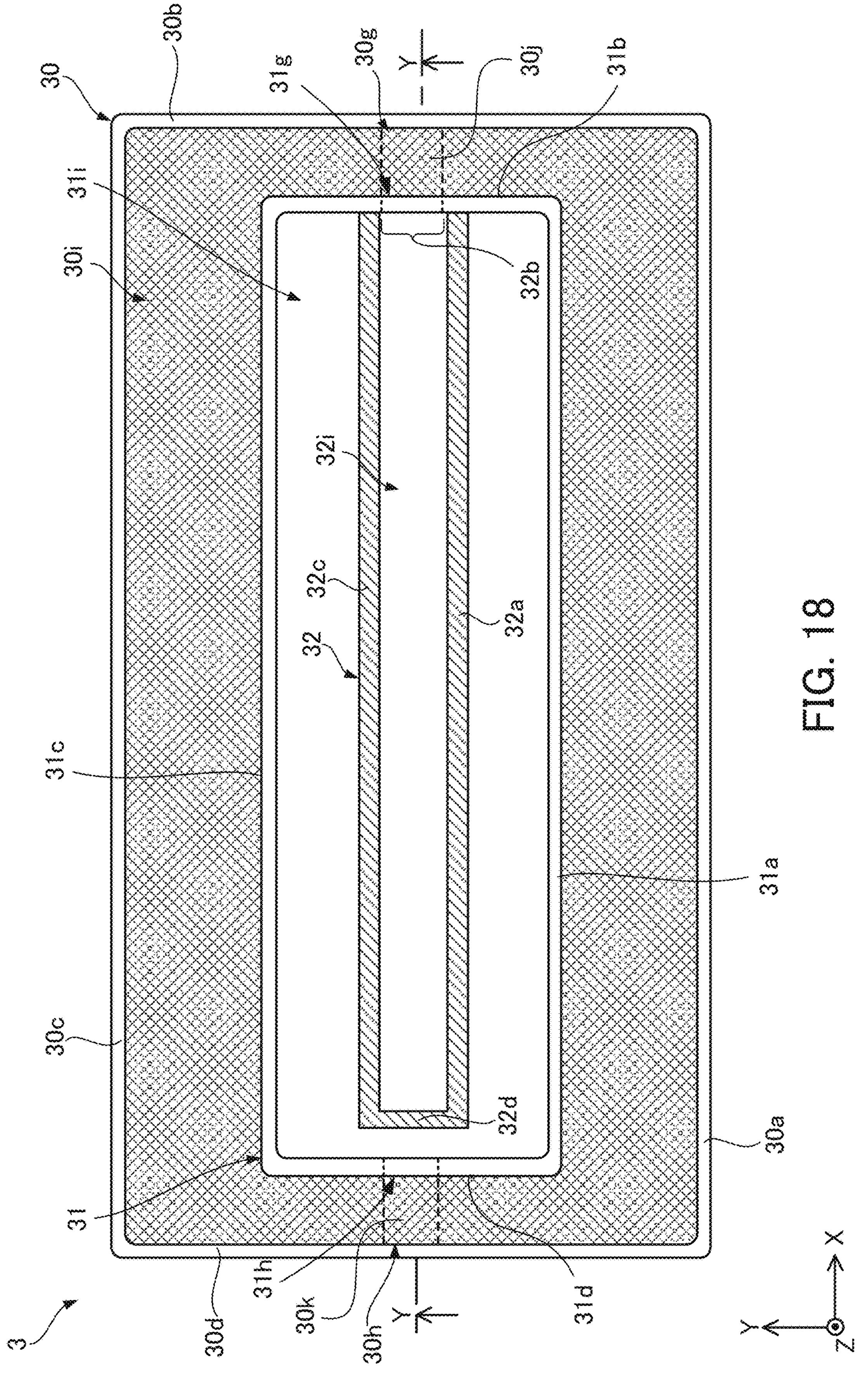
FIG. 18 is a plan view of a cooling device (excluding a guide plate) of a second embodiment.
Figure 19:
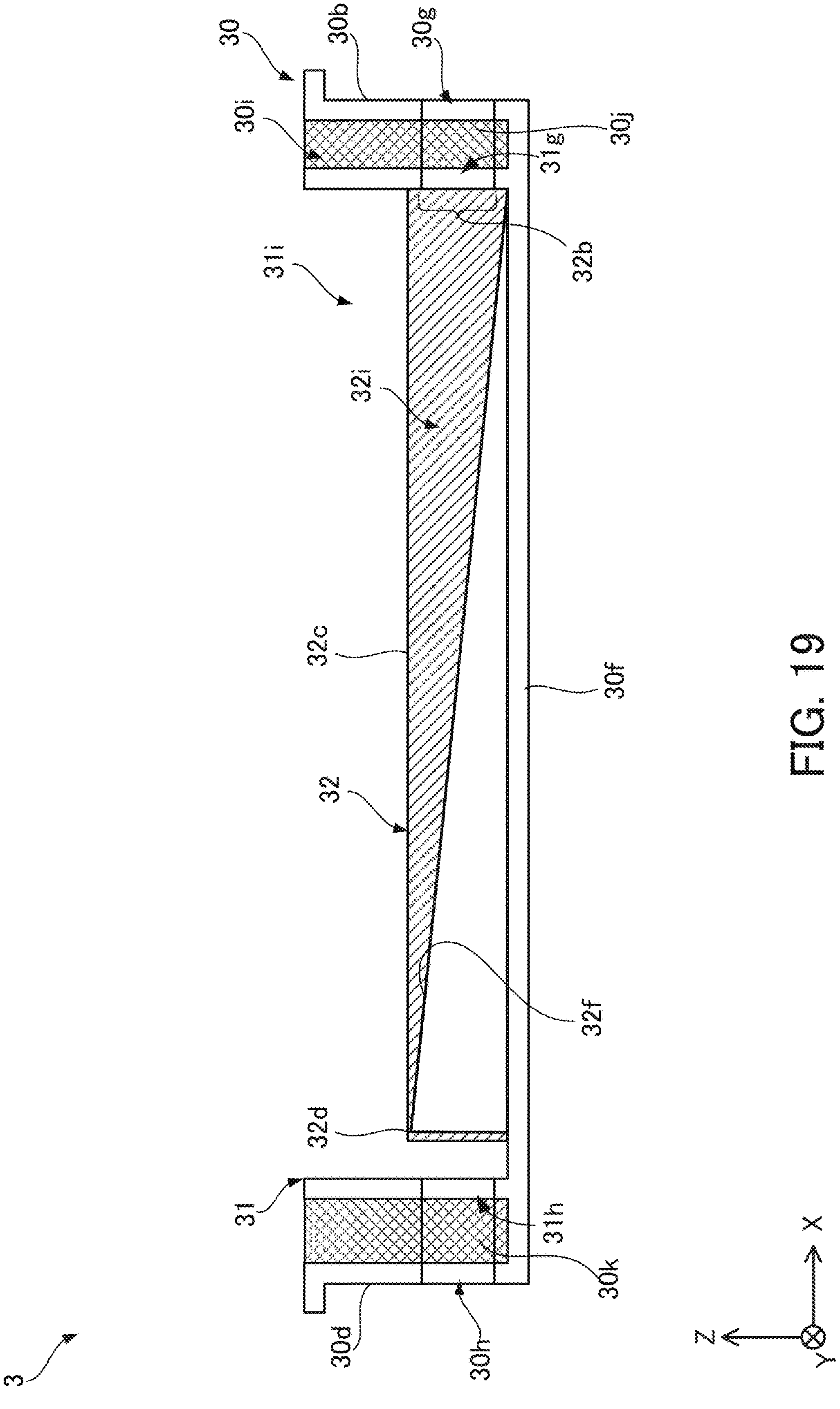
FIG. 19 is a cross-sectional view of the cooling device (excluding the guide plate) of the second embodiment.

Next described is a cooling device according to a second embodiment, with reference to FIGS. 18 and 19. FIG. 18 is a plan view of a cooling device (excluding a guide plate) of the second embodiment. FIG. 19 is a cross-sectional view of the cooling device (excluding the guide plate) of the second embodiment. Note that the cross-sectional view of FIG. 19 is taken along dashed-dotted line Y-Y of FIG. 18.

The guide part 32 of the second embodiment has the guide wall 32*a*, the tip wall 32*d*, and the guide wall 32*c* integrally connected to each other, and includes the first end and the second end, as in the first embodiment. In addition, both the first and second ends are connected to the short lateral wall 31*b* across the inlet 31*g*, similarly to the first embodiment.

Note however that, according to the second embodiment, the guide walls 32*a* and 32*c* extend from the short lateral wall 31*b* toward the short lateral wall 31*d*, parallel to the long lateral as walls 31*a* and 31*c*, illustrated in FIG. 18. The tip wall 32*d* integrally connects the tips (in the −X direction) of the guide walls 32*a* and 32*c*. In FIG. 18, the connection portions between the tip wall 32*d* and the guide walls 32*a* and 32*c* form right angles. The connection portions may have R- or C-chamfered corners. In addition, the tip wall 32*d* may be arc-shaped, as illustrated in FIG. 16.

Furthermore, in the second embodiment, the guide part 32 is formed on the bottom plate 30*f* in such a manner that a bottom surface 32*f* surrounded by the guide part 32 is inclined upward (in the +Z direction) as it goes from the short lateral wall 31*b* toward the short lateral wall 31*d*.

Herewith, the guide area 32*i* surrounded by the guide part 32, the bottom surface 32*f*, and the guide plate 33 (not illustrated in FIGS. 18 and 19) becomes smaller as it moves away from the inlet 31*g* of the pool part 31 when viewed in the inflow direction from the inlet 31*g* toward the guide area 32*i*.

The guide part 32 forming the guide area 32*i* with the above configuration also allows the pressure difference in the refrigerant having entered the guide area 32*i* between the outlet 30*h* (the tip wall 32*d*) side and the inlet 32*b* side to be reduced, similarly to the first embodiment. This facilitates the refrigerant to flow out also from the part of the guide slit 33*g* near the inlet 32*b*. Therefore, the refrigerant having flowed into the guide area 32*i* flows out substantially uniformly from the entire guide slit 33*g*. This in turn reduces variations in the heat dissipation performance depending on the position on the front surface 15*e* of the heat dissipation plate 15, and thus uniformly cools the semiconductor unit 2. The reduced pressure drop enables a reduction in the cost of driving the pump and also reduces the loss of reliability of the semiconductor device 1.

(c) Third Embodiment

Figure 20:
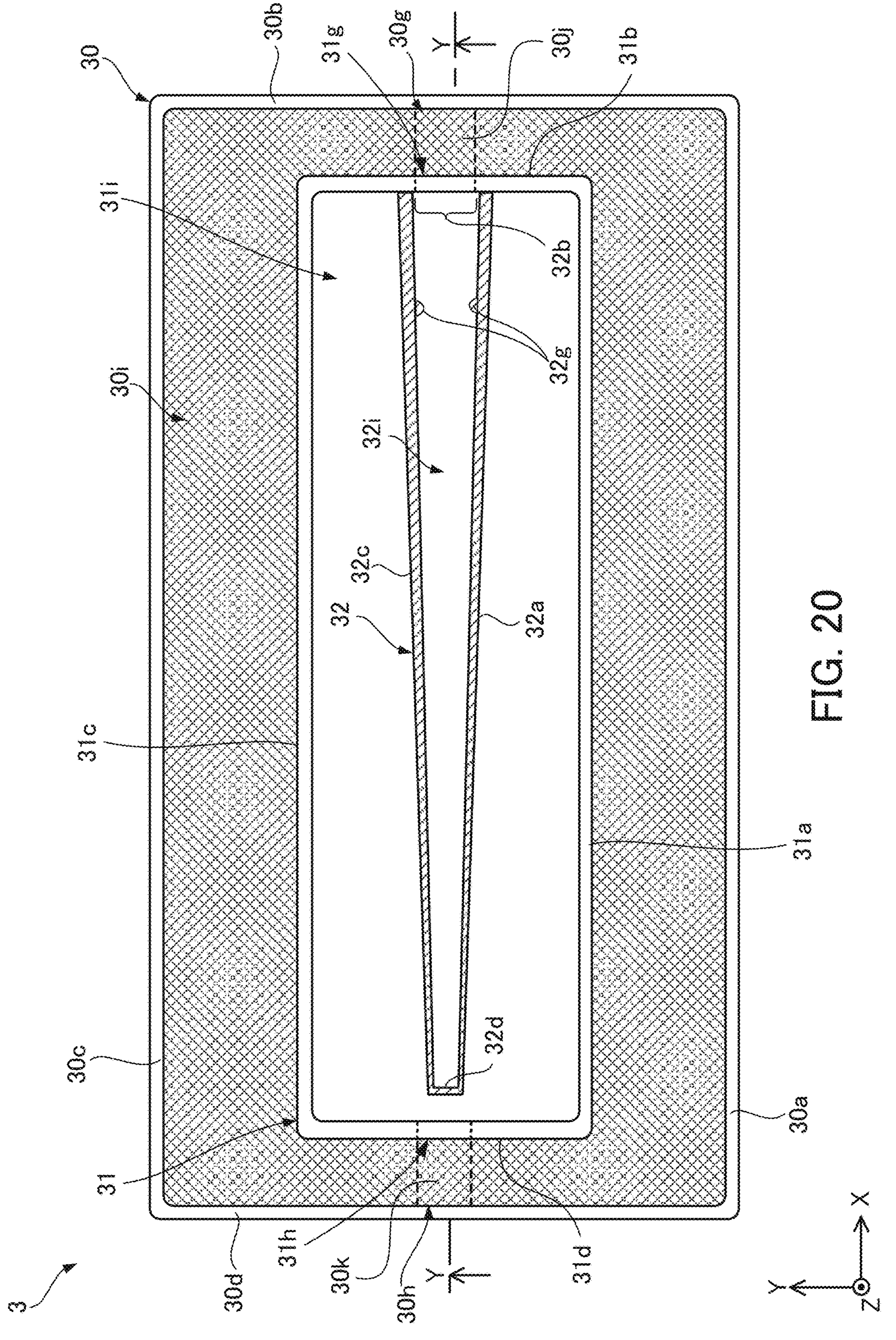
FIG. 20 is a plan view of a cooling device (excluding a guide plate) of a third embodiment.
Figure 21:
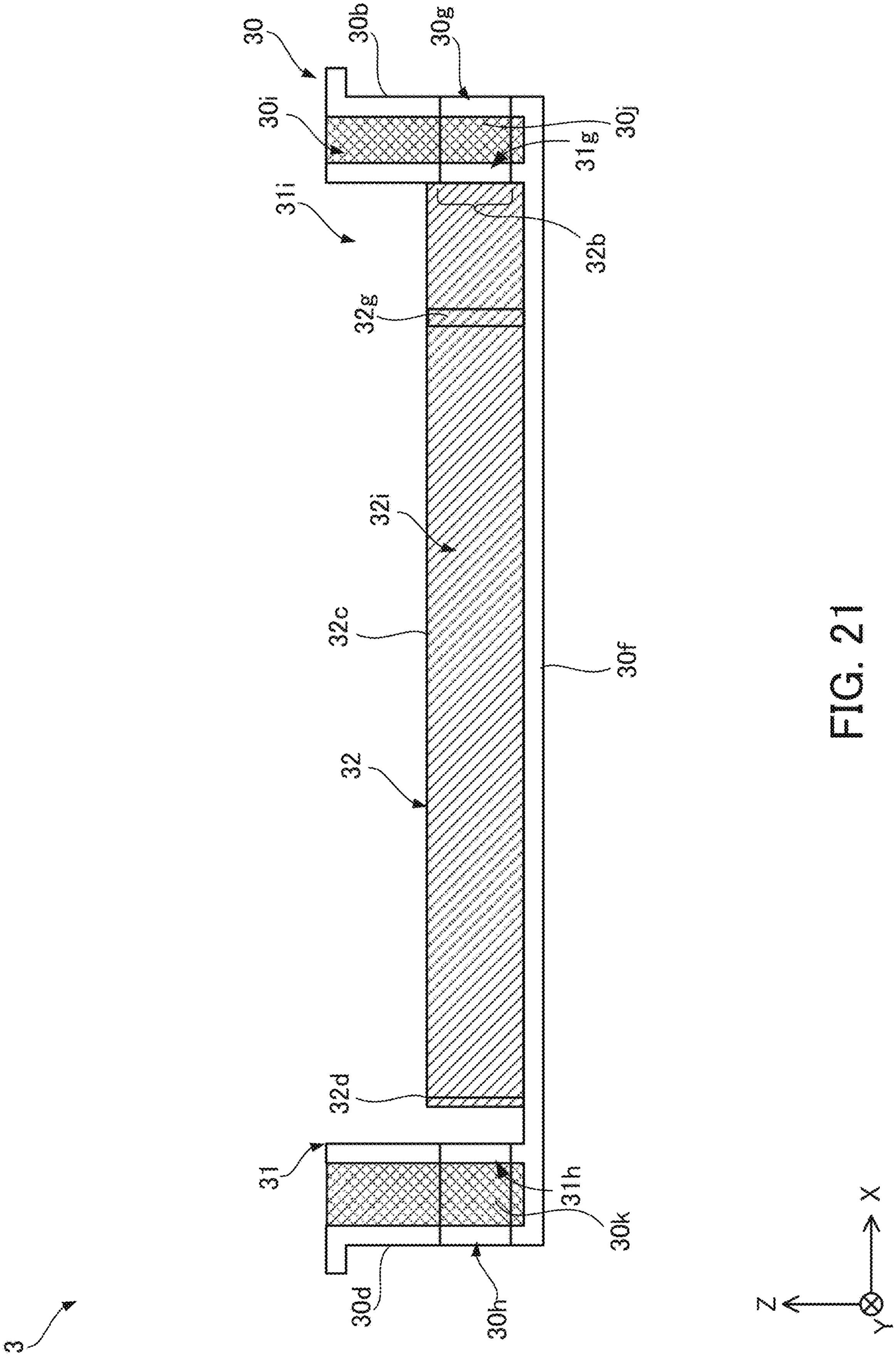
FIG. 21 is a cross-sectional view of the cooling device (excluding the guide plate) of the third embodiment.
Figure 22:
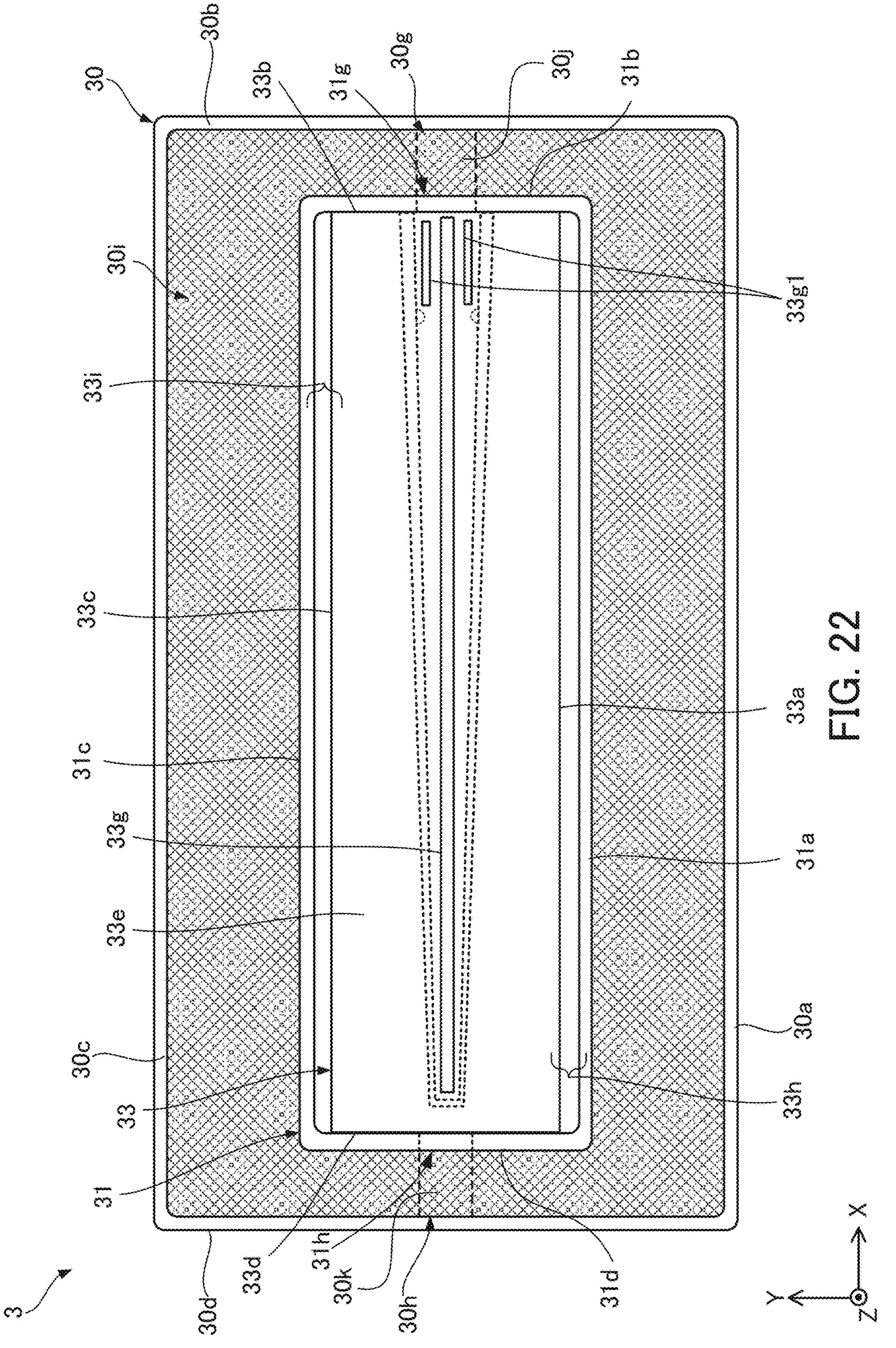
FIG. 22 is another plan view of the cooling device of the third embodiment.

A cooling device of a third embodiment is explained using FIGS. 20 to 22. FIG. 20 is a plan view of a cooling device (excluding a guide plate) of the third embodiment. FIG. 21 is a cross-sectional view of the cooling device (excluding the guide plate) of the third embodiment. FIG. 22 is another plan view of the cooling device of the third embodiment. Note that the cross-sectional view of FIG. 21 is taken along dashed-dotted line Y-Y of FIG. 20.

The cooling device 3 of the third embodiment differs from the cooling device 3 of the first embodiment in having protrusions 32*g*, on the guide walls 32*a* and 32*c* included in the guide part 32, at positions opposing each other. The protrusions 32*g* are formed closer to the inlet 31*g* side in plan view.

These protrusions 32*g* may be formed within 30% of the length of the guide walls 32*a* and 32*c* from the inlet 31*g*. In addition, the protruding amount of the protrusions 32*g* into the guide area 32*i* may be such that the protrusions 32*g* do not obstruct the flow of the refrigerant, and the protrusions 32*g* are sufficient if they project even a little. In addition, the protrusions 32*g* may be rod-shaped in side view and are formed parallel to each other in the ±Z direction from the lower ends to the upper ends of the guide walls 32*a* and 32*c*, as illustrated in FIG. 21. The protrusions 32*g* may be inclined at an obtuse angle with respect to the bottom plate 30*f*. That is, the protrusions 32*g* may be inclined in such a manner that their upper ends are located closer to the outlet 31*h* (the tip wall 32*d*) side. The protrusions 32*g* may each have, for example, a semicircular shape, a triangular shape, or a quadrangular shape in plan view. The example of FIG. 20 depicts the protrusions 32*g* having a semicircular shape.

In addition, the guide plate 33 has sub-slits 33*g*1 formed on both sides (the long lateral face 33*a* and 33*c* sides) of the guide slit 33*g*, within the range sandwiched between the guide walls 32*a* and 32*c* in plan view, as illustrated in FIG. 22. The sub-slits 33*g*1 extend parallel to the guide slit 33*g* toward the short lateral wall 31*d*, from the short lateral wall 31*b* to the protrusions 32*g*. Further, the width of each sub-slit 33*g*1 in the ±Y direction may be the same as the width of the guide slit 33*g* in the same direction, and is, for example, 1 mm or more and 4 mm or less.

This case also allows the pressure difference in the refrigerant having entered the guide area 32*i* between the tip wall 32*d* side and the inlet 32*b* side to be reduced, as in the first embodiment, which facilitates s the refrigerant to flow out also from the part of the guide slit 33*g* near the inlet 32*b*. At this time, the protrusions 32*g* promote smooth flow of the refrigerant having entered the guide area 32*i* toward the guide plate 33. Further, the guide plate 33 has the sub-slits 33*g*1 formed, on both sides of the guide slit 33*g*, near the protrusions 32*g*. This allows the refrigerant having entered the guide area 32*i* to flow out substantially uniformly from the entire guide slit 33*g* and the sub-slits 33*g*1 even more reliably than in the first embodiment.

Note that the refrigerant separated by the protrusions 32*g* flows out from the sub-slits 33*g*1. Therefore, the sub-slits 33*g*1 formed on the guide plate 33 preferably extend, in plan view, from the inlet 31*g* to at least the protrusions 32*g*. The sub-slits 33*g*1 may extend beyond the protrusions 32*g*.

(d) Fourth Embodiment

Figure 24:
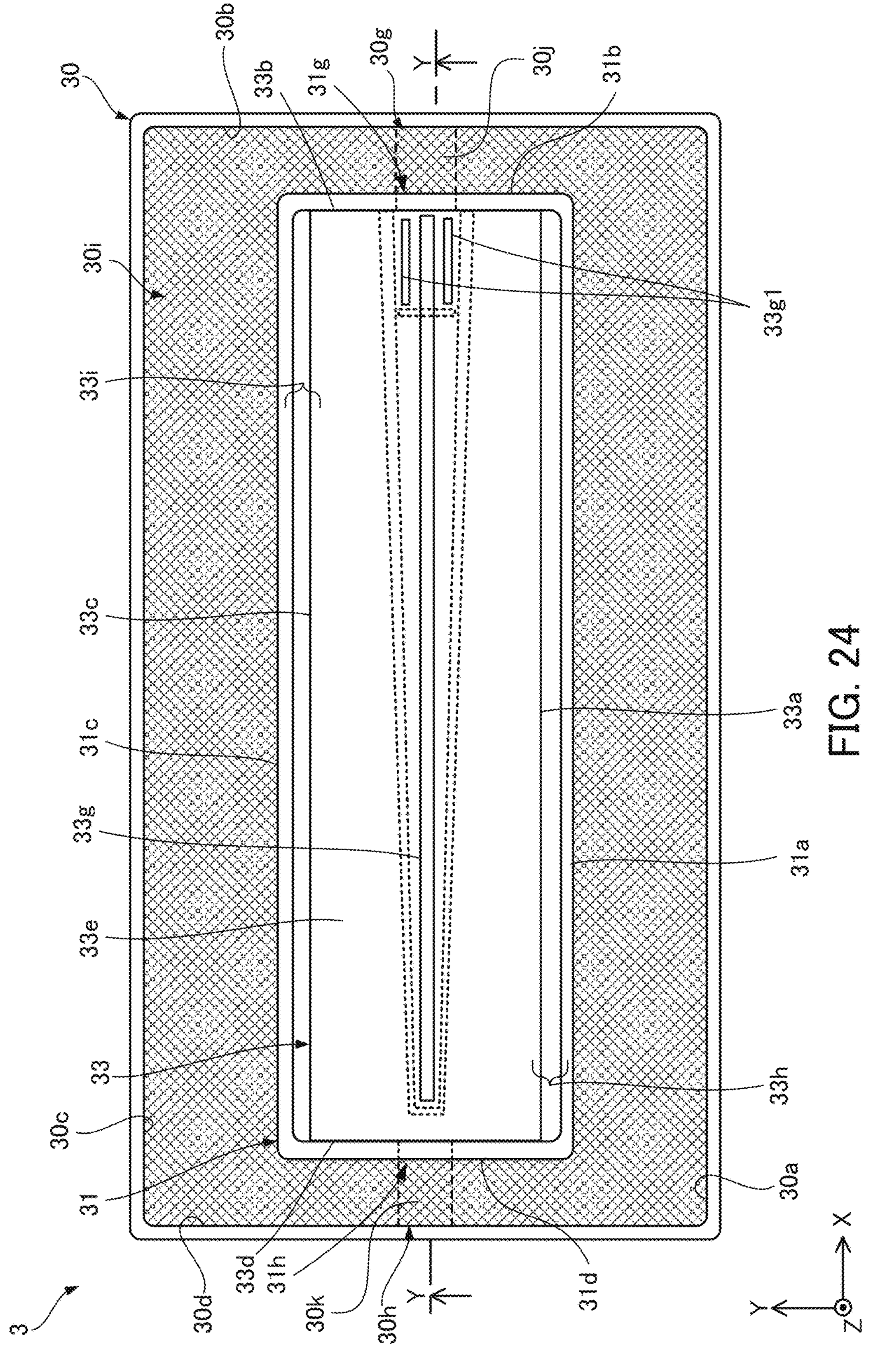
FIG. 24 is a plan view of the cooling device of the fourth embodiment.

Next described is a fourth embodiment where a protrusion is formed on the bottom plate 30*f* of the third embodiment, with reference to FIGS. 23 and 24. FIG. 23 is a cross-sectional view of a cooling device (excluding a guide plate) of the fourth embodiment. FIG. 24 is a plan view of the cooling device of the fourth embodiment. Note that the cross-sectional view of FIG. 23 is taken along dashed-dotted line Y-Y of FIG. 24.

The cooling device 3 of the fourth embodiment differs from the cooling device 3 of the third embodiment in having the protrusion 32*g* not on each of the guide walls 32*a* and 32*c*, but on the bottom plate 30*f*. The protrusion 32*g* of the fourth embodiment is formed, on the bottom plate 30*f*, between the guide walls 32*a* and 32*c* in plan view in such a manner as to run parallel to the short lateral walls 31*b* and 31*d*. The protrusion 32*g* may be formed to connect the guide walls 32*a* and 32*c* in plan view.

In addition, the protruding amount of the protrusion 32*g* into the guide area 32*i* may be such that the protrusion 32*g* does not obstruct the flow of the refrigerant, and the protrusion 32*g* is sufficient if it projects even a little. Further, the protrusion 32*g* may have a columnar shape, such as a semicircular columnar shape, a quadrangular columnar shape, or a triangular columnar shape.

The sub-slits 33*g*1 of the guide plate 33 are also formed on both sides (the long lateral face 33*a* and 33*c* sides) of the guide slit 33*g*, within the range sandwiched between the guide walls 32*a* and 32*c* in plan view, as in the third embodiment. The sub-slits 33*g*1 extend parallel to the guide slit 33*g* toward the short lateral wall 31*d*, from the short lateral wall 31*b* to at least the protrusion 32*g*.

This case also allows the pressure difference in the refrigerant having entered the guide area 32*i* between the tip wall 32*d* side and the inlet 32*b* side to be reduced, as in the second embodiment, which facilitates the refrigerant to flow out also from the part of the guide slit 33*g* near the inlet 32*b*. Further, the guide plate 33 has the sub-slits 33*g*1 formed, on both sides of the guide slit 33*g*, near the protrusion 32*g*. This allows the refrigerant having entered the guide area 32*i* to flow out substantially uniformly from the entire guide slit 33*g* and the sub-slits 33*g*1 even more reliably than in the first embodiment.

Note that the protrusions 32*g* and the sub-slits 33*g*1 of the third and fourth embodiments are also applicable to the second embodiment. Further, the protrusions 32*g* of both the third and fourth embodiments may be provided together. That is, the paired protrusions 32*g* are formed, on the guide walls 32*a* and 32*c* of the guide part 32, at positions opposing each other, and another protrusion 32*g* is also formed on the bottom plate 30*f*. Note that these three protrusions 32*g* may be continuous. In this case, the refrigerant having entered the guide area 32*i* flows out substantially uniformly from the entire guide slit 33*g* and the sub-slits 33*g*1 even more reliably than in the third and fourth embodiments.

(e) Fifth Embodiment

Figure 25:
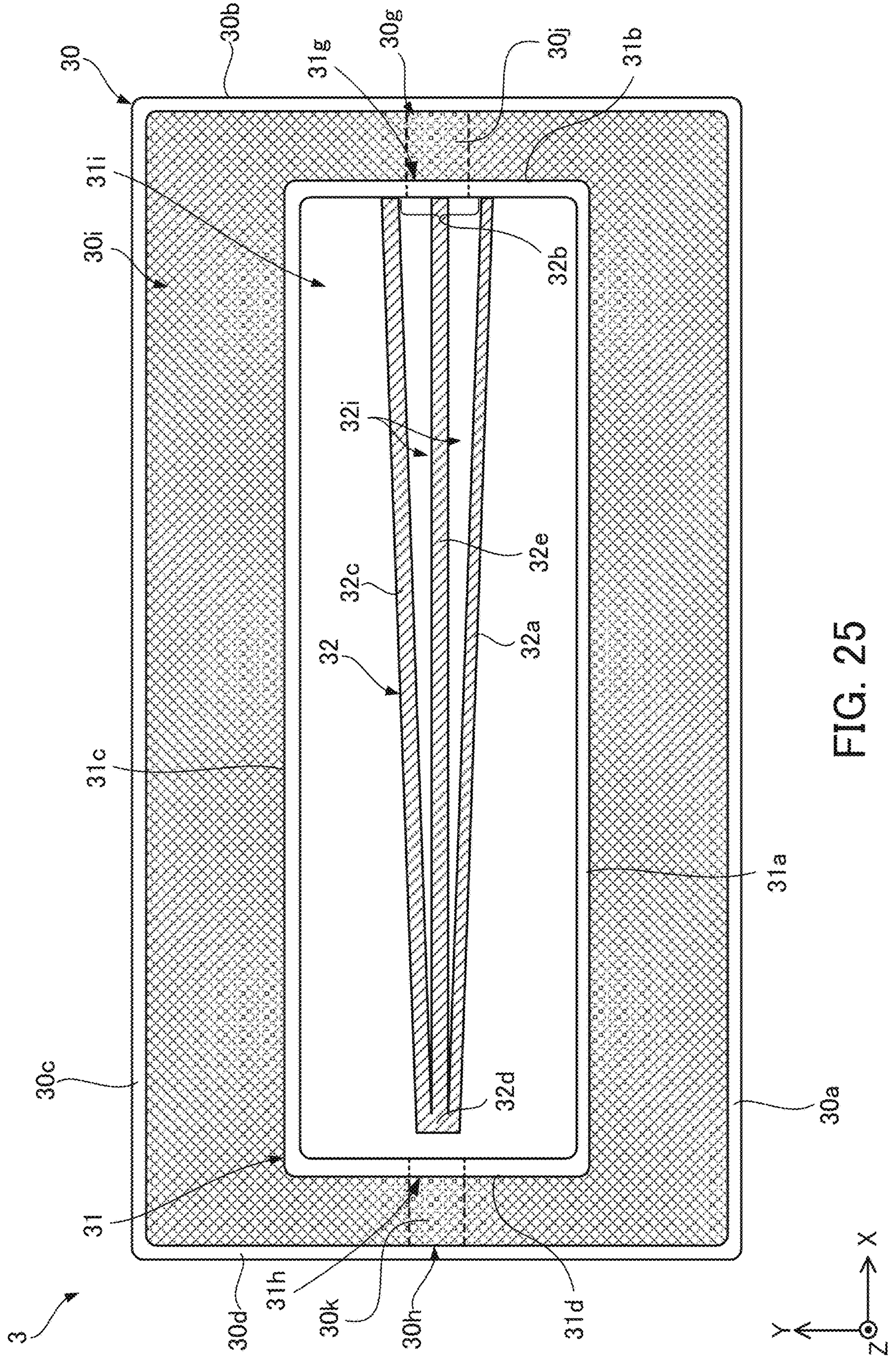
FIG. 25 is a plan view of a cooling device (excluding a guide plate) of a fifth embodiment.
Figure 26:
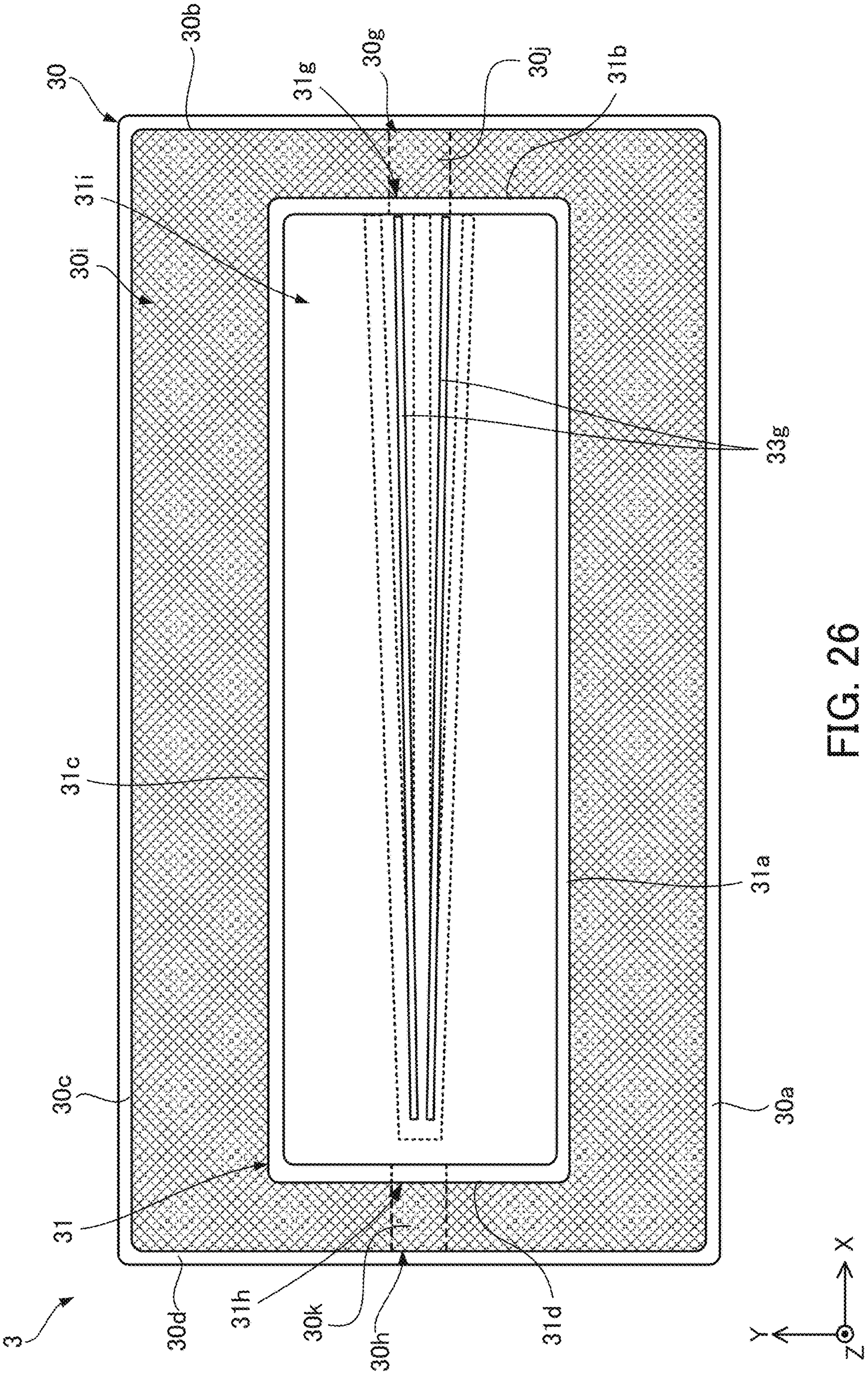
FIG. 26 is another plan view of the cooling device of the fifth embodiment.

Next described is a fifth embodiment where the cooling device 3 of the first embodiment has the guide area 32*i* which is divided into two, with reference to FIGS. 25 and 26. FIG. 25 is a plan view of the cooling device (excluding a guide plate) of the fifth embodiment. FIG. 26 is another plan view of the cooling device of the fifth embodiment.

The cooling device 3 of the fifth embodiment differs from the cooling device 3 of the first embodiment in the guide part 32, which is provided with yet another guide wall 32*e* (a third guide wall) between the guide walls 32*a* and 32*c*, as illustrated in FIG. 25. The third guide wall 32*e* creates two separate guide areas 32*i*.

In addition, in the guide plate 33, two guide slits 33*g* penetrating the guide plate 33 from the front surface 33*e* to the rear surface 33*f* are formed in such a manner as to correspond to the two guide areas 32*i*, as illustrated in FIG. 26. That is, in plan view, the guide plate 33 has the guide slits 33*g*, one of which is formed in an area overlapping the guide area 32*i* sandwiched between the guide walls 32*a* and 32*e* and the other of which is formed in an area overlapping the guide area 32*i* sandwiched between the guide walls 32*c* and 32*e*.

Also in this case, the guide slits 33*g* are formed on the guide plate 33 in such a manner that, when the guide plate 33 is placed on the guide part 32, each of the guide slits 33*g* extends, in plan view, in a straight line toward the tip wall 32*d* from the inlet 32*b* to just before the tip wall 32*d*. The width (in the ±Y direction) of each of the guide slits 33*g* is preferably the same as in the first embodiment. However, because the space for providing the two guide slits 33*g* is limited, the width may be narrower than that of the first embodiment. Here, the width may be, for example, 1 mm.

The two guide areas 32*i* of the fifth embodiment also become smaller as they move away from the inlet 31*g* of the pool part 31 when viewed in the inflow direction from the inlet 31*g* toward the guide areas 32*i*. This configuration allows the pressure difference in the refrigerant having entered each of the guide areas 32*i* between the tip wall 32*d* side and the inlet 32*b* side to be reduced, which facilitates the refrigerant to flow out from each of the two guide slits 33*g* of the guide plate 33. Therefore, the refrigerant having flowed into the guide areas 32*i* flows out substantially uniformly from each of the two entire guide slits 33*g*. This in turn reduces variations in the heat dissipation performance depending on the position on the front surface 15*e* of the heat dissipation plate 15, and thus uniformly cools the semiconductor unit 2. As a result, it is possible to keep the cost of driving the pump down and also reduce the loss of reliability of the semiconductor device 1. Note that the protrusions 32*g* of the third and fourth embodiments may be provided on the guide walls 32*a*, 32*c*, and 32*e*. This allows the refrigerant having flowed into the guide areas 32*i* to flow out substantially uniformly from each of the two entire guide slits 33*g* even more reliably.

Figure 27:
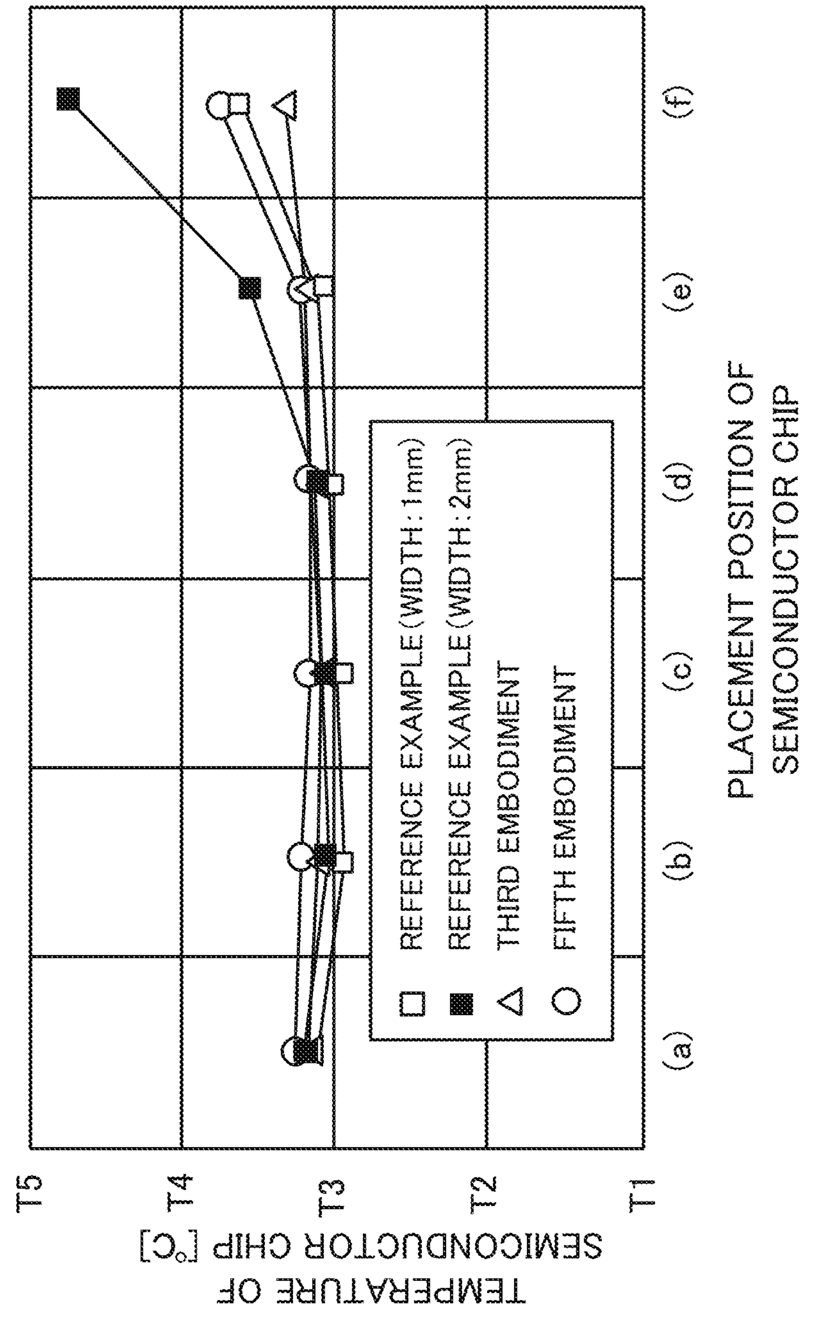
FIG. 27 is a graph plotting temperature of semiconductor chips relative to their placement positions.
Figure 28:
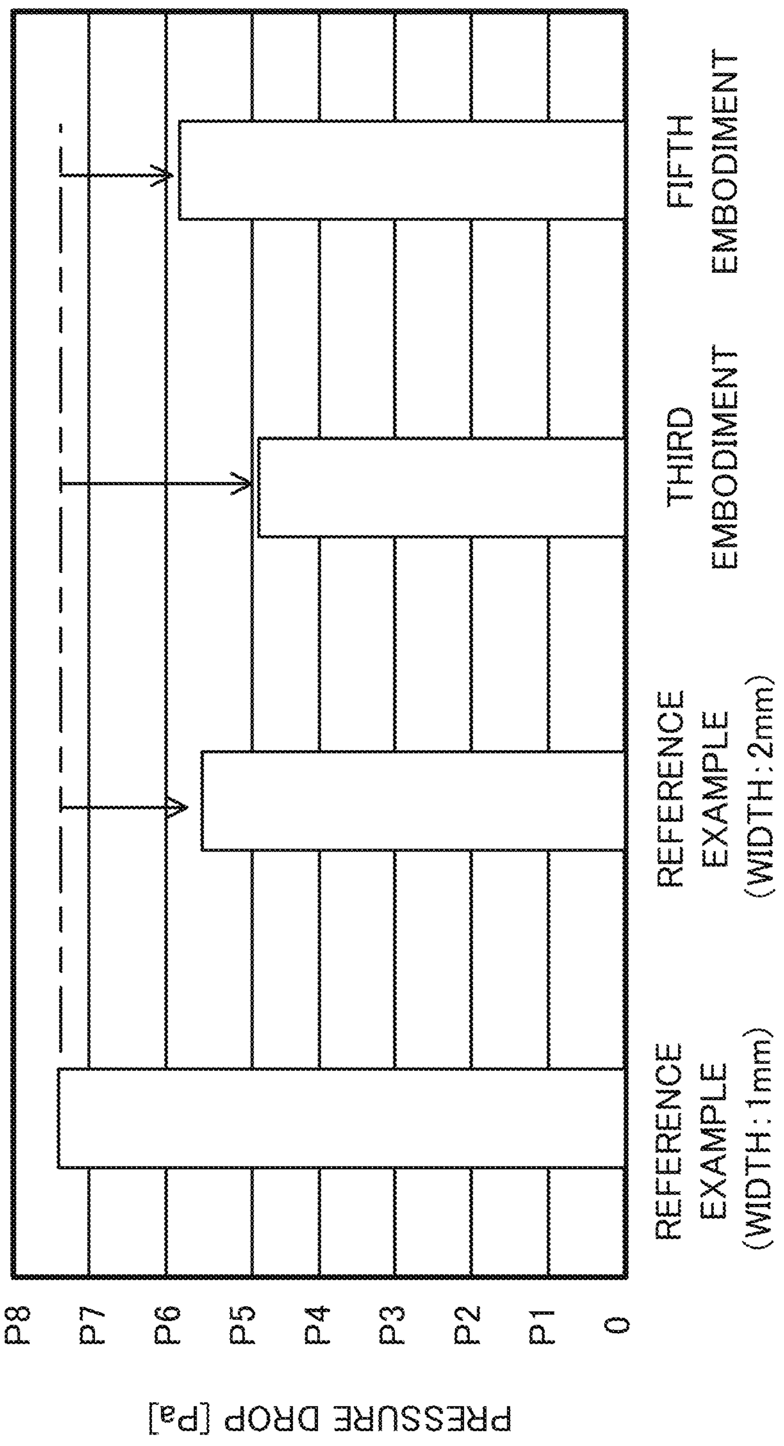
FIG. 28 is a graph of pressure drop.

Next described is the heat dissipation performance with reference to FIGS. 27 and 28. Here, the heat dissipation performance achieved by the cooling device 3 of the third and fifth embodiments among the above-described embodiments, as well as the heat dissipation performance achieved by the cooling device 300 of the reference example are examined. FIG. 27 is a graph plotting the temperature of the semiconductor chips relative to their placement positions. FIG. 28 is a graph of pressure drop.

Note that the horizontal axis of FIG. 27 indicates the placement positions of the semiconductor chips 14 while the vertical axis indicates the temperature of the semiconductor chips 14. The placement positions of the semiconductor chips 14 are (a) to (f) assigned to the semiconductor chips 14 of FIG. 1, in order from the short lateral face 15*d* (the outlet 31*h*) side toward the short lateral face 15*b* (the inlet 31*g*) side. In addition, T1 to T5 on the vertical axis of FIG. 27 represent measured values, which increase from T1 to T5.

Further, FIG. 28 depicts how much pressure drop is reduced compared to the reference example with a slit width of 1 mm. The horizontal axis of FIG. 28 represents the measurement targets while the vertical axis represents the pressure drop ([Pa]), which is the pressure difference in the refrigerant between the outlet 31*h* and the inlet 31*g*. Note that P1 to P8 on the vertical axis of FIG. 28 represent measured values, which increase from P1 to P8. The reference example examined here includes two cases in which the width of the guide slit 33*g* is 1 mm and 2 mm.

Temperature measurements were taken for the semiconductor chips 14 included in the semiconductor unit 2 after being cooled for a predetermined time, using the semiconductor devices each including one of the following cooling devices: the cooling devices 300 according to the two cases of the reference example; and the cooling devices 3 according to the third and fifth embodiments. At this time, the pressure of the refrigerant was also measured at the inlet 31*g* and at the outlet 31*h*, and their difference was obtained.

The results illustrated in the graph of FIG. 27 indicate that, in both of the two cases of the reference example, the temperature of the semiconductor chips 14 on the inlet 31*g* side is higher than that of the semiconductor chips 14 at other positions. That is, in the two cases of the reference example, it is considered that the heat dissipation performance is reduced on the inlet 31*g* side. When the two cases of the reference example are compared, it can be seen that the decrease in the heat dissipation performance of the semiconductor chips 14 on the inlet 31*g* side is suppressed in the case with the narrower slit width.

On the other hand, it can be observed that the semiconductor chips 14 at all the positions are cooled almost equally in the third embodiment. The fifth embodiment suppresses the decrease in the heat dissipation performance on the inlet 30*g* side, compared to the case of the reference example with a slit width of 2 mm.

According to the graph of FIG. 28, the pressure drop is suppressed the most in the third embodiment, and is reduced by about 35% compared to the reference example with a slit width of 1 mm. In the case of the fifth embodiment, the pressure drop is reduced by about 20% compared to the reference example with a slit width of 1 mm.

Therefore, the results illustrated in FIGS. 27 and 28 suggest that the cooling device 3 of the third embodiment enables uniform cooling of the multiple semiconductor chips 14 and sufficiently suppresses pressure drop.

Although not being able to uniformly cool the multiple semiconductor chips 14 compared to the third embodiment, the cooling device 3 of the fifth embodiment exhibits improved heat dissipation capabilities to the same extent as the reference example with a slit width of 1 mm. In addition, the cooling device 3 of the third embodiment suppresses pressure drop more compared to the reference example with a slit width of 2 mm.

According to an aspect, it is possible to suppress an increase in pressure drop in the refrigerant and improve the cooling performance, thereby avoiding the loss of reliability.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:

a semiconductor chip;

a heat dissipation plate, having:

a front surface including a placement area, a rear surface having a cooling area corresponding to the placement area, and a plurality of fins provided in the cooling area;

the semiconductor chip being disposed in the placement area;

a pool part, including:

a bottom surface having a rectangular shape in a plan view of the semiconductor device, a pair of long lateral faces, and a first short lateral face and a second short lateral face, with an inlet formed on the first short lateral face, to thereby define a pool space surrounded by the bottom surface, the pair of long lateral faces and the first and second short lateral faces;

a guide part configured to be installed in the pool space on the bottom surface, the guide part having a first end and a second end that are both connected to an inner side of the first short lateral face, at positions opposite to each other across the inlet, so as to separate a guide space from the pool space, the guide space communicating with the inlet; and a guide plate disposed in the pool space on the guide part, the guide plate having a shape of a flat plate with a slit, wherein in the plan view of the semiconductor device, the guide plate is positioned to have two gaps on two opposite sides thereof, respectively between the guide plate and the pair of long lateral faces, and the slit is formed within an area of the guide plate overlapping the guide space;

the rear surface of the heat dissipation plate is disposed on the pool part in such a manner that the plurality of fins is housed in the pool space and over the guide plate; and the guide part is installed such that a geometrical area of a cross-section of the guide space becomes smaller as the cross-section is farther away from the inlet of the pool part.

2. The semiconductor device according to claim 1, wherein:

the guide part includes:

a first guide wall having an upstream end and a downstream end, the upstream end thereof constituting the first end of the guide part, the first guide wall being inclined such that the downstream end thereof is closer to a center line passing through a center of the inlet and running parallel to the pair of long lateral faces, than is the upstream end thereof, a second guide wall having an upstream end and a downstream end, the upstream end thereof constituting the second end of the guide part, the second guide wall being inclined such that the downstream end thereof is closer to the center line than is the upstream end thereof, and a tip wall which connects the downstream ends of the first guide wall and the second guide wall.

3. The semiconductor device according to claim 2, wherein:

the guide part has a protrusion provided in a vicinity of the inlet in such a manner as to project into the guide space.

4. The semiconductor device according to claim 3, wherein:

the protrusion includes a plurality of protrusions, which is individually provided, on the first guide wall and the second guide wall, at positions opposing each other.

5. The semiconductor device according to claim 4, wherein:

the guide plate has a pair of sub-slits respectively formed on two sides of the slit and running parallel to the slit, and the pair of sub-slits extend, in the plan view, from the vicinity of the inlet to the protrusions.

6. The semiconductor device according to claim 5, wherein:

each of the pair of sub-slits has a width of 1 mm or more and 4 mm or less.

7. The semiconductor device according to claim 3, wherein:

the protrusion is provided on the bottom surface within the guide space.

8. The semiconductor device according to claim 7, wherein:

the guide plate has a pair of sub-slits respectively formed on two sides of the slit and running parallel to the slit, and the pair of sub-slits extend, in the plan view, from the vicinity of the inlet to the protrusion.

9. The semiconductor device according to claim 8, wherein:

each of the pair of sub-slits has a width of 1 mm or more and 4 mm or less.

10. The semiconductor device according to claim 1, wherein:

the guide part includes:

a first guide wall which, in the plan view, extends parallel to the pair of long lateral faces, the first guide wall having an upstream end and a downstream end, the upstream end thereof constituting the first end of the guide part, a second guide wall which extends parallel to the pair of long lateral faces, the second guide wall having an upstream end and a downstream end, the upstream end thereof constituting the second end of the guide part, and a tip wall which connects the downstream ends of the first guide wall and the second guide wall, and the bottom surface in the guide space is inclined upward toward the guide plate, such that farther away is a portion of the bottom surface from the inlet, closer is the portion to the guide plate.

11. The semiconductor device according to claim 1, wherein:

the guide part includes:

a first guide wall having an upstream end and a downstream end, the upstream end thereof constituting the first end of the guide part, the first guide wall being inclined such that the downstream end thereof is closer to a center line passing through a center of the inlet and running parallel to the pair of long lateral faces, than is the upstream end thereof, a second guide wall having an upstream end and a downstream end, the upstream end thereof constituting the second end of the guide part, the second guide wall being inclined such that the downstream end thereof is closer to the center line than is the upstream end thereof, a third guide wall which is provided on the center line and extends from the inlet, and a tip wall which connects the downstream ends of the first guide wall and the second guide wall.

12. The semiconductor device according to claim 11, wherein:

the slit of the guide plate includes a plurality of slits, which is individually provided, in the plan view, in a first area of the guide plate overlapping the guide space sandwiched between the first guide wall and the third guide wall, and a second area of the guide plate overlapping the guide space sandwiched between the third guide wall and the second guide wall.

13. The semiconductor device according to claim 1, wherein:

the second short lateral face of the pool part has an outlet, opposing the inlet, formed therein.

* * * * *